(12) United States Patent
Jeong et al.

(10) Patent No.: US 9,275,920 B2
(45) Date of Patent: Mar. 1, 2016

(54) SEMICONDUCTOR APPARATUS AND STACKED SEMICONDUCTOR APPARATUS FOR CHECKING FORMATION AND CONNECTION OF THROUGH SILICON VIA

(71) Applicant: SK hynix Inc., Icheon-si, Gyeonggi-do (KR)

(72) Inventors: Chun Seok Jeong, Icheon-si (KR); Jae Jin Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 55 days.

(21) Appl. No.: 14/216,265

(22) Filed: Mar. 17, 2014

(65) Prior Publication Data

US 2014/0209907 A1    Jul. 31, 2014

Related U.S. Application Data

(62) Division of application No. 13/339,018, filed on Dec. 28, 2011, now abandoned.

(30) Foreign Application Priority Data

Jun. 29, 2011    (KR) .......................... 10-2011-0063781

(51) Int. Cl.
| | |
|---|---|
| H01L 23/58 | (2006.01) |
| H01L 21/66 | (2006.01) |
| H01L 23/48 | (2006.01) |
| G01R 31/28 | (2006.01) |
| H01L 25/065 | (2006.01) |
| H01L 25/00 | (2006.01) |

(52) U.S. Cl.
CPC ............ *H01L 22/34* (2013.01); *G01R 31/2884* (2013.01); *H01L 23/481* (2013.01); *H01L 25/0657* (2013.01); *H01L 25/50* (2013.01); *H01L 2224/16146* (2013.01); *H01L 2225/06513* (2013.01); *H01L 2225/06541* (2013.01); *H01L 2225/06544* (2013.01); *H01L 2225/06596* (2013.01)

(58) Field of Classification Search
CPC ... H01L 22/34; H01L 23/481; H01L 25/0657; H01L 2224/16146; H01L 2225/06513; H01L 2225/06541; H01L 2225/06544; H01L 2225/06596; H01L 25/50
USPC .......................................... 257/48
See application file for complete search history.

(56) References Cited

U.S. PATENT DOCUMENTS

| | | |
|---|---|---|
| 2006/0228825 A1 | 10/2006 | Hembree |
| 2010/0013512 A1 | 1/2010 | Hargan et al. |
| 2010/0321042 A1 | 12/2010 | Agarwal et al. |
| 2011/0080185 A1 | 4/2011 | Wu et al. |
| 2012/0091593 A1* | 4/2012 | Cheng .................. H01L 21/743 257/774 |

* cited by examiner

*Primary Examiner* — Thanh T Nguyen
(74) *Attorney, Agent, or Firm* — William Park & Associates Ltd.

(57) ABSTRACT

A semiconductor apparatus includes a TSV formed to be electrically connected with another chip and a TSV test unit configured to check a capacitance component of the TSV to generate a TSV abnormality signal.

34 Claims, 14 Drawing Sheets

SEMICONDUCTOR APPARATUS AND STACKED SEMICONDUCTOR APPARATUS FOR CHECKING FORMATION AND CONNECTION OF THROUGH SILICON VIA

CROSS-REFERENCES TO RELATED APPLICATION

The present application claims priority under 35 U.S.C. §119(a) to Korean application number 10-2011-0063781 filed on Jun. 29, 2011 in the Korean Intellectual Property Office, which is incorporated by reference in its entirety.

BACKGROUND

1. Technical Field

The present invention relates to a semiconductor apparatus, and more particularly, to a semiconductor apparatus with TSVs (through-silicon vias).

2. Related Art

Capacities and speeds of semiconductor memories, which are used as memory devices in most electronic systems, have steadily increased. Various attempts have been made to mount a memory with increased capacity within a smaller area and drive the memory efficiently.

In order to improve the degree of integration of semiconductor memories, a three-dimensional (3D) layout, in which a plurality of memory chips is stacked, has been adopted in place of the existing two-dimensional (2D) layout. As memories trend toward higher integration and higher capacity, the 3-D layout is being used more to increase the capacity and decrease the size of a semiconductor memory devices.

A TSV (through-silicon via) type has been used in the 3D layout structure. The TSV type has been adopted as an alternative for overcoming degradation of a transmission speed due to a distance to a controller on a module, poor data bandwidth, and degradation of a transmission speed due to variables in a package. In the TSV type, paths are defined to pass through a plurality of memory chips, and electrodes are formed in the paths so that respective memory chips and a controller can communicate with each other. In a stacked semiconductor memory apparatus to which the TSV type is applied, wires, sub packages and package balls, which are used in an SIP type and a POP type, are not needed, and electrodes are connected directly over a controller in such a way as to have paths which pass is through a plurality of memory chips. Bumps are formed between the paths which pass through the plurality of memory chips, to electrically connect the plurality of memory chips to each other and to a controller.

FIG. 1 is a schematic cross-sectional view explaining processing errors that may occur when forming TSVs in a semiconductor device.

FIG. 1 shows a metal layer 10 for forming a TSV, a dielectric layer 20, and a wafer layer 30.

While not shown in FIG. 1, connection layers (not shown) may be electrically connected to the upper and lower ends of the metal layer 10.

The connection layers are formed of a conductive substance for connecting the TSV with another TSV or a controller. In general, the connection layers are constituted by bumps.

(a) of FIG. 1 shows the case in which the TSV is normally formed in a semiconductor chip.

Referring to (a) of FIG. 1, a path is defined to pass through the wafer layer 30, and the metal layer 10 made of a metallic substance is normally formed in the path.

In the TSV, in order to isolate the metal layer 10 and the wafer layer 30 from each other, the dielectric layer 20 such as an oxide is formed between the metal layer 10 and the wafer layer 30.

(b) and (c) of FIG. 1 show the cases in which the metal layer 10 is abnormally formed in the path surrounded by the dielectric layer 20.

If a variation occurs in process conditions for forming the TSV, the metal layer 10 may be abnormally formed in the course of filling the metal layer 10 in the path surrounded by the dielectric layer 20.

In the event that the metal layer 10 is formed with an open type gap as shown in (b) of FIG. 1, a current path is not created between an electrode e1 and an electrode e2. Therefore, the TSV formed as in (b) of FIG. 1 cannot transfer a signal.

In the event that the metal layer 10 is formed with a void type gap as shown in (c) of FIG. 1, although a current path is created between an electrode e3 and an electrode e4, the current path has a large resistance value due to the presence of the void type gap. Therefore, the TSV formed as in (c) of FIG. 1 cannot stably transfer a signal.

FIG. 2 is a schematic cross-sectional view explaining processing errors that may occur when connecting chips formed with TSVs.

Referring to FIG. 2, a first chip 201 and a second chip 202 are formed with three TSVs are connected with each other. Bumps 203 are formed on both ends of the TSVs of the respective chips 201 and 202 to be electrically connected with the TSVs.

(d) of FIG. 2 shows the case in which bumps to be connected with the TSVs are normally formed such that the TSV of the first chip 201 and the TSV of the second chip 202 are normally connected with each other.

Referring to (d) of FIG. 2, it is shown that a bump 203-1 connected to the TSV of the first chip 201 and a bump 203-2 connected to the TSV of the second chip 202 are normally connected with each other.

Hence, the TSV of the first chip 201 and the TSV of the second chip 202 formed as shown in (d) of FIG. 2 are electrically connected with each other and can communicate normally with each other.

(e) and (f) of FIG. 2 show that bumps connected to TSVs are abnormally formed so that processing error occur.

Referring to (e) of FIG. 2, a bump 203-4 connected to the TSV of the second chip 202 is abnormally formed by being shifted.

Hence, a bump 203-3 connected to the TSV of the first chip 201 and the bump 203-4 connected to the TSV of the second chip 202 may not be electrically connected with each other, or even when they are electrically connected with each other, they cannot normally implement signal communication due to high resistance from the offset bumps 203-3 and 203-4.

Referring to (f) of FIG. 2, it is shown that a bump is not formed on the TSV of the second chip 202.

Hence, since a bump 203-5 connected to the TSV of the first chip 201 cannot be electrically connected with the TSV of the second chip 202, signal communication can not be implemented.

As can be seen from FIGS. 1 and 2, a processing error may be caused in the course of forming TSVs in semiconductor chips or connecting a plurality of chips formed with TSVs with one another.

If a subsequent process is continuously performed for a product in which the processing error is caused in the course of forming TSVs in semiconductor chips or connecting a plurality of chips formed with TSVs with one another, the manufacturing yield decreases, the productivity deteriorates, and additional costs are incurred.

SUMMARY

A semiconductor apparatus capable of checking whether TSVs are normally formed is described.

A stacked semiconductor apparatus capable of checking whether a plurality of chips with TSVs is normally connected is described.

In one embodiment of the present invention, a semiconductor apparatus includes a TSV formed to be electrically connected with another chip and a TSV test unit configured to check a capacitance component of the TSV to generate a TSV abnormality to signal.

In another embodiment of the present invention, a stacked semiconductor apparatus includes a first chip having a first TSV connected between a first node and a second node, a second chip having a second TSV connected between a third node and a fourth is node, and a connection unit configured to electrically connect the second node and the third node with each other. The first chip includes a first TSV test unit configured to check a capacitance value of the first TSV and generate a first single test result in a single TSV test mode, and supply a power supply voltage to the first node in a stacked TSV test mode. The second chip includes a second TSV test unit configured to check a capacitance value of the second TSV and generate a second single test result in the single TSV test mode, and electrically connect the third node and a fifth node with each other in the stacked TSV test mode.

BRIEF DESCRIPTION OF THE DRAWINGS

Features, aspects, and embodiments are described in conjunction with the attached drawings.

DETAILED DESCRIPTION

A semiconductor apparatus and a stacked semiconductor apparatus according to the present invention will be described below with reference to the accompanying drawings through exemplary embodiments. Various references will be made to activated signals and deactivated signals. In positive logic, an activated signal refers to a signal asserted to a high voltage level, and a deactivated signal refers to a signal deasserted to a low voltage level. Similarly, in negative logic, an activated signal refers to a signal asserted to a low voltage level, and a deactivated signal refers to a signal deasserted to a high voltage level. However, the invention need not be limited this way. The terms "activate" and "deactivate" should be interpreted in context of the circuit being described.

Figure 3:
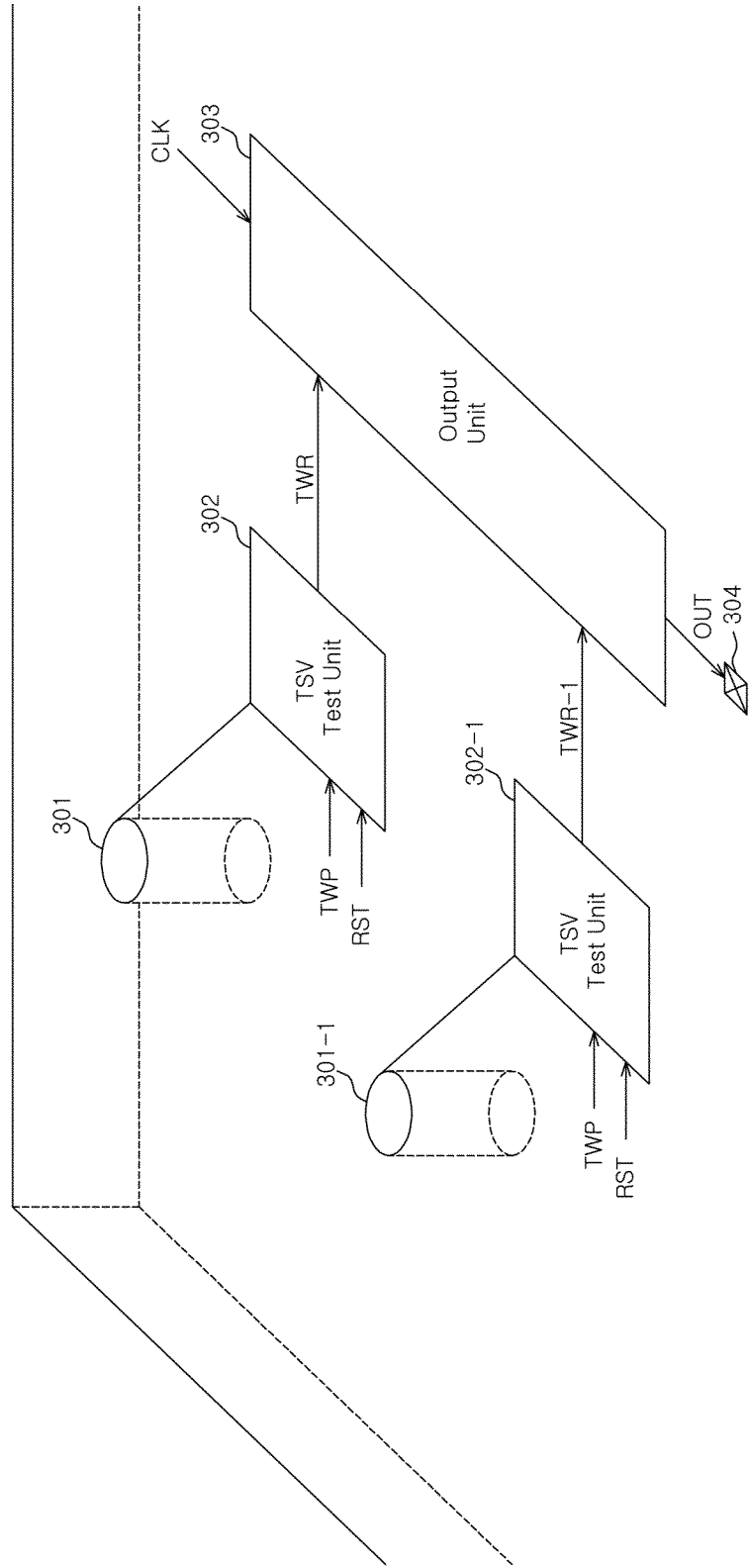
FIG. 3 is a schematic view illustrating an exemplary semiconductor apparatus in accordance with an embodiment of the present invention.

FIG. 3 is a schematic view illustrating a semiconductor apparatus in accordance with an embodiment of the present invention.

The semiconductor apparatus 1 shown in FIG. 3 includes a through-silicon via (TSV) 301 and a TSV test unit 302.

The TSV 301 may include a TSV (for example, the electrode part 10 of FIG. 1) formed to be electrically connected with another chip.

The TSV test unit 302 is configured to check the capacitance component of the TSV 301 and generate a TSV abnormality signal TWR.

Figure 1:
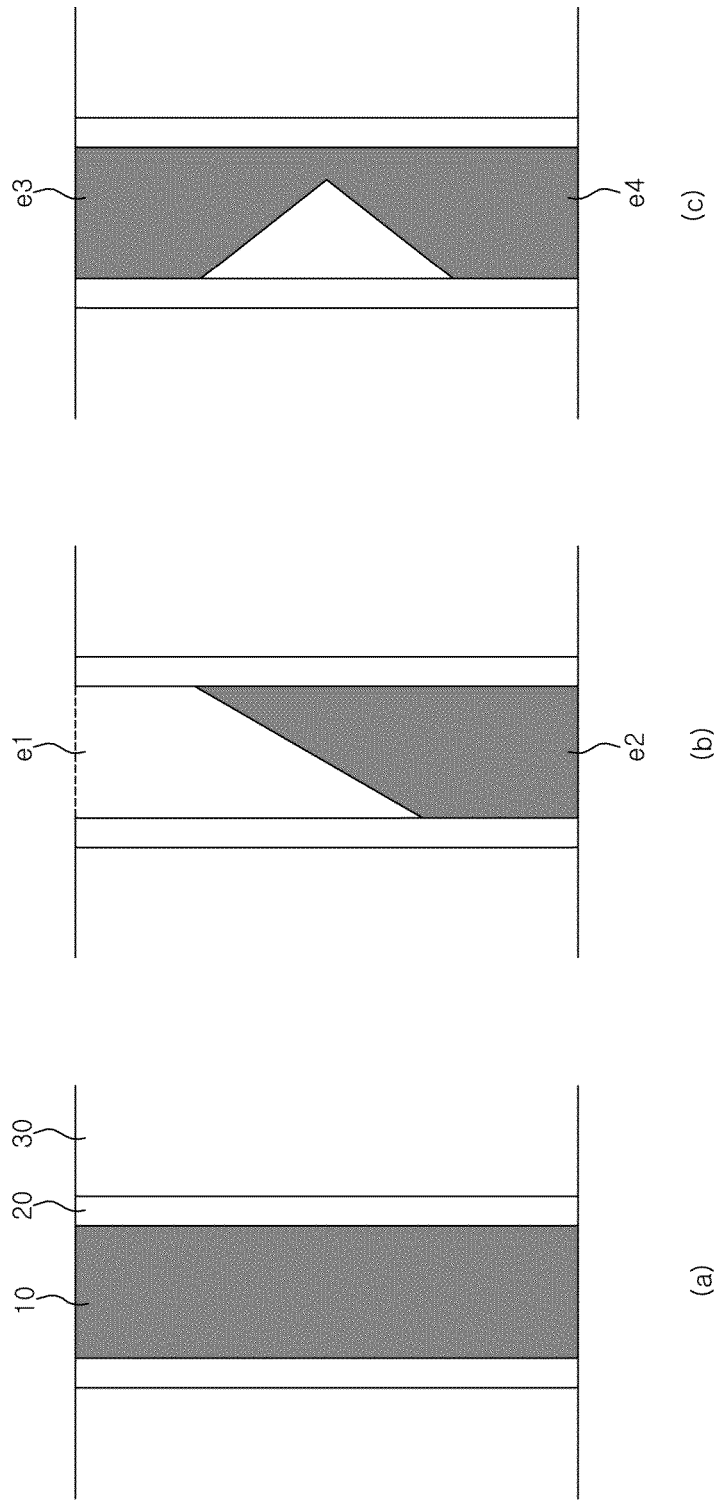
FIG. 1 is a schematic cross-sectional view explaining processing errors that may occur when forming TSVs in a semiconductor device.

In the TSVs shown in FIG. 1, the electrode parts 10 surrounded by the dielectric layer 20 has capacitance components.

Also, in the TSVs shown in FIG. 1, the volumes occupied by the electrode parts 10 are different from one another in the cases of (a), (b) and (c).

The fact that the volumes occupied by the electrode parts 10 made of a metallic substance are different from one another means that the capacitance components of the electrode parts 10 are different from one another.

Since the volumes of the electrode parts 10 in the cases of (b) and (c) are smaller than the volume of the electrode part 10 in the case of (a), the capacitance values of the TSVs in the cases of (b) and (c) are smaller than the capacitance value of the TSV in the case of (a).

In the semiconductor apparatus 1 in accordance with an embodiment of the present invention, such a principle is employed so that the abnormality of the TSV 301 may be checked by checking the capacitance component of the TSV 301. For example, the semiconductor apparatus 1 may check whether the capacitance value of the TSV 301 is equal to or larger than a predetermined value, and may output the TSV abnormality signal TWR to indicate that the TSV 301 is normally formed or the TSV 301 is suitable for communication.

The semiconductor apparatus 1 in accordance with the embodiment of the present invention may be configured to further include an output unit 303.

The output unit 303 is configured to receive and latch a plurality of TSV abnormality signals TWR and TWR-1 which are outputted from a plurality of TSV test units 302 and 302-1 allocated to a plurality of TSVs 301 and 301-1, and serially output the plurality of TSV abnormality signals TWR and TWR-1 as an output signal OUT in response to a clock signal CLK.

A configuration may be made such that the output signal OUT of the output unit 303 is outputted to an external device through a predetermined pad 304, where the external device may be external to the single chip or stacked chips being tested. In the case where the output signal OUT may be outputted to the outside through the predetermined pad 304, a semiconductor apparatus manufacturer may check whether or not an abnormality has occurred in the corresponding chip by checking the output signal OUT, and then may determine whether to perform a subsequent process. Therefore, since an unnecessary process may not be performed for a failed chip, the manufacturing cost of a semiconductor apparatus may be reduced and the productivity may be improved.

Figure 4:
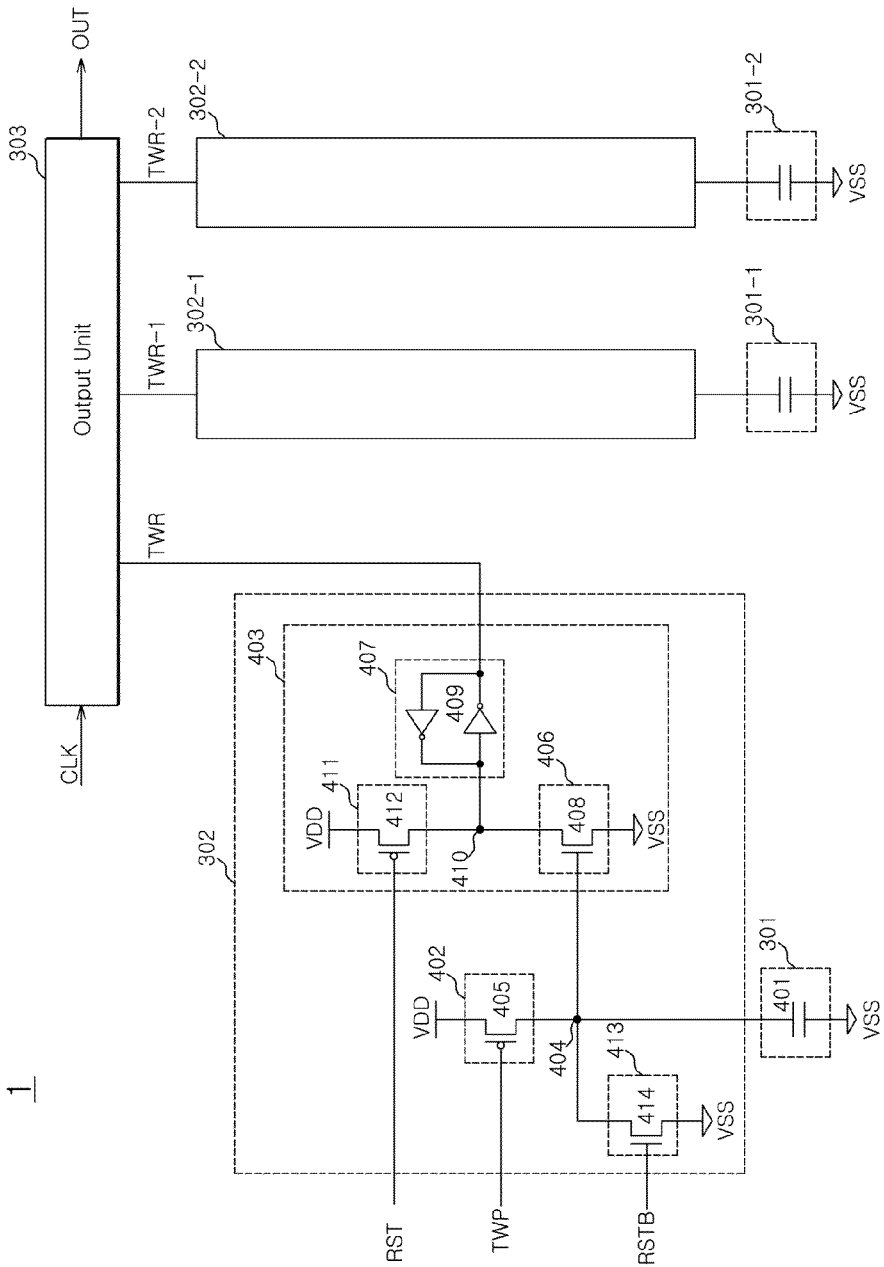
FIG. 4 is a detailed circuit diagram explaining an exemplary operation principle of the semiconductor apparatus shown in FIG. 3.

FIG. 4 is a detailed circuit diagram explaining an exemplary operation principle of the semiconductor apparatus 1 shown in FIG. 3.

As can be seen from FIG. 3, the semiconductor apparatus 1 includes the TSV 301, the TSV test unit 302, and the output unit 303.

The semiconductor apparatus 1 shown in FIG. 4 is exemplified, without a limiting sense, as including three TSVs 301, 301-1, and 301-2, three TSV test units 302, 302-1, and 302-2, and one output unit 303.

The semiconductor apparatus 1 is configured to check the capacitance components of the TSVs 301, 301-1, and 301-2. In FIG. 4, a capacitance component 401 is shown as a capacitor element.

In order to avoid repeated explanations, the TSV 301 and the TSV test unit 302 will be representatively described.

The TSV test unit 302 may include a charge node supply section 402 and a test result checking section 403.

The charge node supply section 402 is configured to charge a charge node 404 in response to a test pulse TWP.

The charge node 404 is electrically connected with the TSV 301 and has the capacitance component 401 of the TSV 301.

The test result checking section 403 is configured to generate the TSV abnormality signal TWR depending upon the voltage level of the charge node 404.

The semiconductor apparatus 1 shown in FIG. 4 changes the voltage level of the charge node 404 by performing a charging operation for the charge node 404 that has the capacitance component 401 of the TSV 301, through the charge node supply section 402.

If the amount of charges transferred to the charge node 404 by the charge node supply section 402 is constant, the voltage level of the charge node 404 varies depending upon the value of the capacitance component 401.

Thus, the semiconductor apparatus 1 in accordance with the is embodiment of the present invention may check the value of the capacitance component 401 by checking the voltage level of the charge node 404.

Also, the semiconductor apparatus 1 may check whether or not the value of the capacitance component 401 is normal, by checking the voltage level of the charge node 404 through the test result checking section 403.

The charge node supply section 402 may include a PMOS transistor 405.

The PMOS transistor 405 is connected between a power supply voltage VDD and the charge node 404 and receives the test pulse TWP through the gate terminal.

If the test pulse TWP is activated to a low level, the PMOS transistor 405 is turned on and forms a current path from the power supply voltage VDD to the charge node 404. Accordingly, the PMOS transistor 405 charges the charge node 404.

The test pulse TWP may be configured as a pulse signal with a predetermined pulse width. The semiconductor apparatus 1 in accordance with the embodiment of the present invention may check the value of the capacitance component 401 by supplying a constant amount of charges to the charge node 404 and detecting a change in the voltage level of the charge node 404. The test pulse TWP may be configured as the pulse signal with the predetermined pulse width to supply the constant amount of charges to the charge node 404.

The test result checking section 403 may include a determination node sink stage 406 and a signal output stage 407.

The determination node sink stage 406 is configured to discharge a determination node 410 depending upon the voltage level of the charge node 404.

The determination node sink stage 406 may include an NMOS transistor 408.

The NMOS transistor 408 is connected between the determination node 410 and a ground voltage VSS, and the gate terminal of the NMOS transistor 408 is connected to the charge node 404. The NMOS transistor 408 is turned on depending upon the voltage level of the charge node 404 and serves to discharge the determination node 410 when turned on. If the voltage level of the charge node 404 increases, the degree to which the NMOS transistor 408 is able to discharge the determination node 410 increases.

The signal output stage 407 is configured to output the voltage level of the determination node 410 as the TSV abnormality signal TWR.

The signal output stage 407 may include an output driver which is generally known in the art.

Further, the signal output stage 407 may include a latch circuit which is electrically connected with the determination node 410. If the signal output stage 407 is configured to include the latch circuit for latching the determination node 410, as the voltage level of the determination node 410 decreases to a lower voltage, the output of the signal output stage 407 will change to a high level when the is determination node 410 goes to a low enough voltage. If there is not enough voltage from the determination node sink stage 406 from the charge node 404, the output of the signal output stage 407 may remain at a low level. This may correspond to when a TSV is normal and has high capacitance, thereby charging the charge node 404 slowly. Conversely, when a TSV has defects such that it has low capacitance, the charge node 404 will charge faster, and the determination node 410 may drop to a low enough voltage that the output of the signal output stage 407 goes to a high level. The high level will indicate that the TSV under test is defective.

Advantages of the signal output stage 407 configured to generate the TSV abnormality signal TWR by comparing the discharging degree of the determination node sink stage 406 and the latching degree of the latch circuit are provided as described below.

First, the voltage level of the TSV abnormality signal TWR may be generated to be advantageous for discrimination of a logic value. If the level of the TSV abnormality signal TWR is momentarily changed from a logic high level to a logic low level or vice versa, the discrimination of the logic value of the TSV abnormality signal TWR may be implemented in an advantageous manner.

Second, by changing the designed value of the latch circuit, it is possible to determine at which value of the capacitance component 401 of the TSV 301 the logic value of the TSV abnormality signal TWR is changed.

Since the discharging degree of the determination node sink is stage 406 is determined depending upon the value of the capacitance component 401 of the TSV 301, the normal standard of the capacitance component 401 of the TSV 301 may be determined by changing the designed value of the latch circuit, that is, the latching degree of the latch circuit.

The signal output stage 407 for such a setting may include a latch circuit 409 shown in FIG. 4.

The latch circuit 409 may be electrically connected with the determination node 410 and latch the voltage level of the determination node 410.

The output signal of the latch circuit 409 may be outputted as the TSV abnormality signal TWR.

The test result checking section 403 may further include a determination node initialization stage 411.

The determination node initialization stage 411 is configured to initialize the voltage level of the determination node 410.

The determination node initialization stage 411 initializes the voltage level of the determination node 410 in response to a reset signal RST.

The determination node initialization stage 411 may include a PMOS transistor 412. The PMOS transistor 412 is connected between the power supply voltage VDD and the determination node 410 and receives the reset signal RST through the gate terminal thereof.

The PMOS transistor 412 is turned on when the reset signal RST is activated to a low level and initializes the determination node 410 to a high level.

The TSV test unit 302 may further include a charge node initializing section 413 which is configured to initialize the voltage level of the charge node 404.

The charge node initializing section 413 initializes the voltage level of the charge node 404 in response to a reset signal RSTB.

The charge node initializing section 413 may include an NMOS transistor 414.

The NMOS transistor 414 is connected between the charge node 404 and the ground voltage VSS and receives the reset signal RSTB through the gate terminal thereof.

The NMOS transistor 414 is turned on when the reset signal RSTB is activated to a high level and initializes the charge node 404 to a low level.

The reset signal RSTB is a signal which has an inverted level of the reset signal RST.

Figure 5:
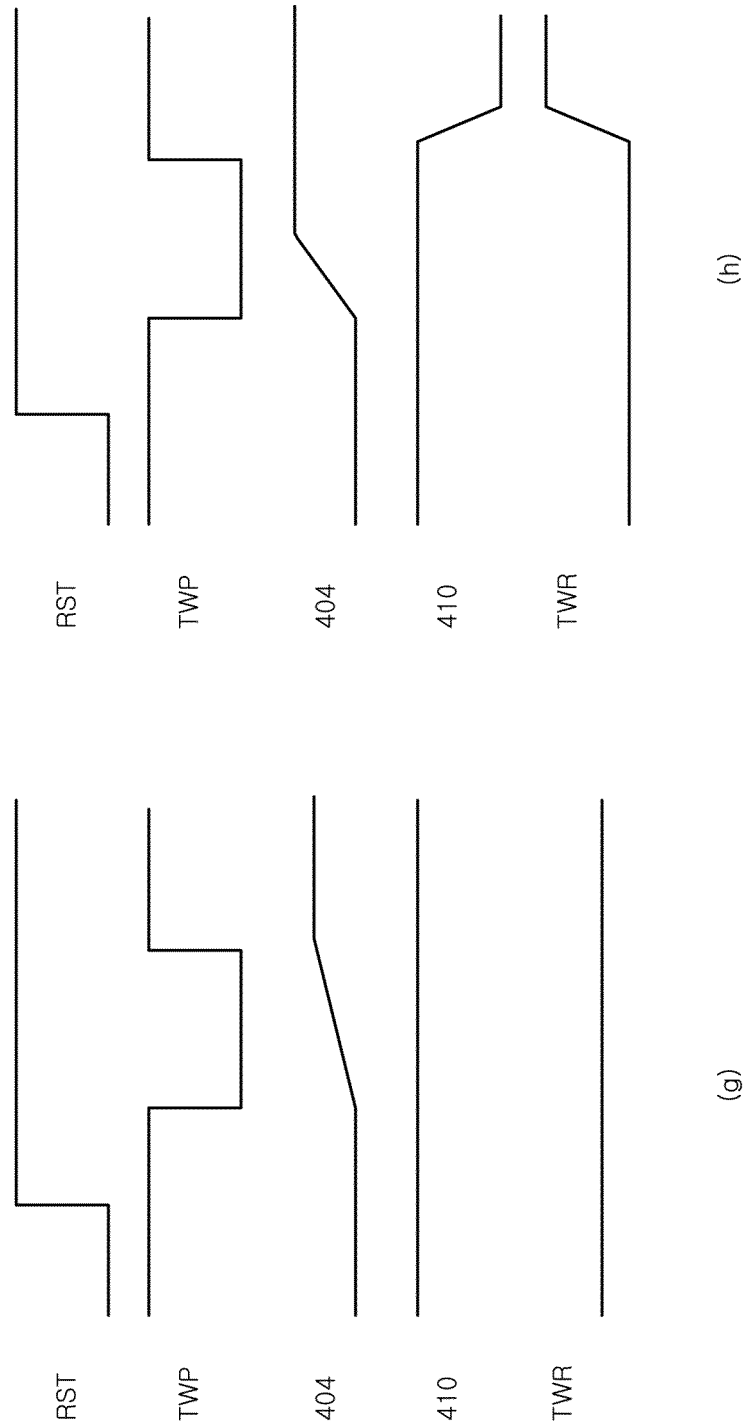
FIG. 5 shows timing diagrams explaining the operations of the TSV test unit shown in FIG. 4.

FIG. 5 is of timing diagrams explaining the operations of the TSV test unit 302 shown in FIG. 4.

(g) of FIG. 5 is a timing diagram in the case where the TSV 301 is normally formed and the capacitance component 401 of the TSV 301 is sufficiently large as in the case of (a) of FIG. 1. (h) of FIG. 5 is a timing diagram in the case where the TSV 301 is abnormally formed as in the cases of (b) and (c) of FIG. 1, and accordingly the capacitance component 401 of the TSV 301 is less than that of a normal TSV.

The TSV test unit 302 shown in FIG. 4 may operate as follows.

While the reset signal RST is activated to the low level and the test pulse TWP is deactivated to a high level, the PMOS transistor 405 of the charge node supply section 402 is turned off, and the PMOS transistor 412 of the determination node initialization stage 411 and the NMOS transistor 414 of the charge node initializing section 413 are turned on.

Accordingly, the voltage level of the charge node 404 is initialized to a low level, and the NMOS transistor 408 of the determination node sink stage 406 is turned off.

Moreover, the determination node 410 is charged by the determination node initialization stage 411 and is initialized to a high level. Here, the TSV abnormality signal TWR goes to a low level due to the latch circuit 409 of the signal output stage 407 inverting the high level of the determination node 410.

If the reset signal RST is deactivated to a high level, the PMOS transistor 412 and the NMOS transistor 414 are turned off.

Thereafter, if the test pulse TWP is activated to the low level for a predetermined time, the PMOS transistor 405 is turned on and charges the charge node 404 for the predetermined time.

Due to this fact, the voltage level of the charge node 404 is increased according to the capacitance value of the TSV 301.

Referring to (g) of FIG. 5, it can be seen that because the capacitance value is sufficiently large, the voltage level of the charge node 404 increases slowly.

Hence, although the NMOS transistor 408 is turned on and discharges the determination node 410, since the voltage level of the charge node 404 is not sufficiently high enough, the NMOS transistor 408 does not discharge the determination node 410 to change the of the latch circuit 409 to a high level.

Therefore, the TSV abnormality signal TWR maintains the low level.

Referring to (h) of FIG. 5, the capacitance value is smaller than the case of (g) due to a defective TSV. Accordingly, the voltage level of the charge node 404 increases sharply during the period when the test pulse TWP is activated to the low level.

Hence, the NMOS transistor 408 is turned on and discharges the determination node 410. Since the voltage level of the charge node 404 is sufficiently high, the NMOS transistor 408 discharges the determination node 410 to a low enough voltage that the latch circuit 409 is able to change its output level from a low level to a high level.

Therefore, as the determination node 410 transitions to a low enough voltage level, the latch circuit 409 changes its output to a high level. Accordingly, the TSV abnormality signal TWR transitions to the high level.

As a consequence, the TSV test unit 302 may generate the TSV abnormality signal TWR which has different values depending is upon the capacitance value of the TSV 301. Thus, the semiconductor apparatus 1 shown in FIGS. 3 and 4 may be used to check whether a TSV is normally formed or not.

The reset signal RST may be configured using the same signal as the test pulse TWP. The test pulse TWP and the reset signal RST are signals which are activated at different times. Thus, even when the waveform of the test pulse TWP shown in FIG. 5 is used as the same waveform of the test pulse TWP and the reset signal RST, the semiconductor apparatus 1 shown in FIGS. 3 and 4 may generate, without any problem, the TSV abnormality signal TWR which has different values depending upon the capacitance value of the TSV 301.

A person skilled in the art who understands the above-described operations of the semiconductor apparatus 1 may appreciate that even when the waveform of the test pulse TWP is used as the reset signal RST in place of the waveform of the reset signal RST shown in FIG. 5, the semiconductor apparatus 1 may generate the TSV abnormality signal TWR which has different values depending upon the capacitance value of the TSV 301. Therefore, the waveform of the reset signal RST shown in FIG. 5 may be changed when embodying the present invention. It is to be noted that the waveform of the reset signal RST shown in FIG. 5 does not limit the waveform of the reset signal RST which is needed in an embodiment of the present invention.

However, in order for the operation of the output unit 303 which will be described below, the reset signal RST may have the waveform of the reset signal RST shown in FIG. 5. This will be described later in detail.

Figure 6:
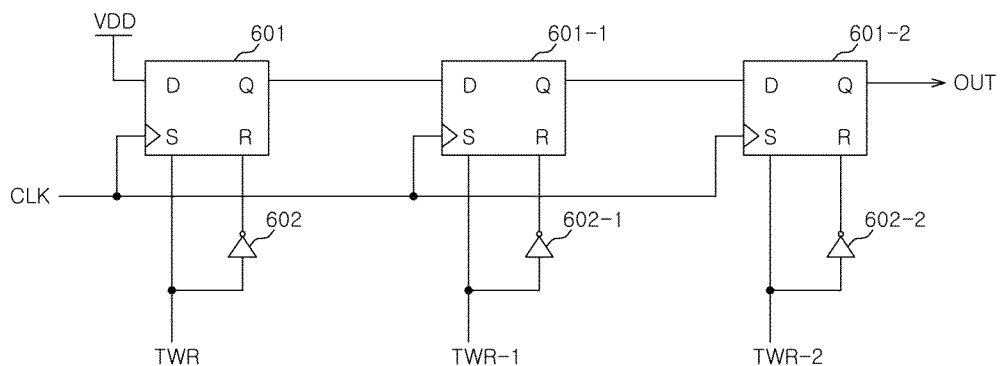
FIG. 6 is a circuit diagram illustrating an exemplary embodiment of the output unit shown in FIGS. 3 and 4.

FIG. 6 is a circuit diagram illustrating an exemplary embodiment of the output unit 303 shown in FIGS. 3 and 4.

Without a limiting sense, the output unit 303 shown in FIG. 6 is configured to receive and latch three TSV abnormality signals TWR, TWR-1, and TWR-2 and serially output the TSV abnormality signals TWR, TWR-1 and TWR-2 as the output signal OUT in response to the clock signal CLK.

The output unit 303 may include one flip-flop and one inverter for each TSV abnormality signal. As can be seen from FIG. 6, the output unit 303, which is configured to receive the three TSV abnormality signals TWR, TWR-1, and TWR-2 and serially output the TSV abnormality signals TWR, TWR-1, and TWR-2 as the output signal OUT, may include three flip-flops 601, 601-1, and 601-2 and three inverters 602, 602-1, and 602-2.

The flip-flops 601, 601-1, and 601-2 may include delay flip-flop circuits which have set terminals S and reset terminals R.

The three flip-flops 601, 601-1, and 601-2 are configured to have serial input and output relationships.

The inverters 602, 602-1, and 602-2, allocated for the respective TSV abnormality signals TWR, TWR-1, and TWR-2, invert the TSV abnormality signals TWR, TWR-1, and TWR-2.

The three flip-flops 601, 601-1 and 601-2 receive the TSV abnormality signals TWR, TWR-1, and TWR-2 respectively allocated is through the set terminals S, and receive the outputs of the inverters 602, 602-1, and 602-2 through the reset terminals R.

The three flip-flops 601, 601-1, and 601-2 have latch values of 1 or 0 depending upon the signals received through the set terminals S and the reset terminals R, and serially output the values one bit at a time as the output signal OUT in response to the clock signal CLK.

As described above, in order for the operation of the output unit 303, the reset signal RST may have the waveform of the reset signal RST shown in FIG. 5.

The output unit 303 outputs the data latched by the flip-flops 601, 601-1, and 601-2 as the output signal OUT in response to the clock signal CLK. Accordingly, the TSV abnormality signals TWR, TWR-1, and TWR-2 received through the set terminals S of the flip-flops 601, 601-1 and 601-2 and the inverters 602, 602-1, and 602-2 may maintain the same logic value until the next triggering edge of the clock signal CLK.

In FIG. 5, if the clock signal CLK is a signal which completes toggling before the test pulse TWP is initialized in response to the reset signal RST, even when the reset signal RST which is the same as the test pulse TWP shown in FIG. 5 is used, the semiconductor apparatus 1 shown in FIG. 4 may check without any problem whether the TSV 301 is normal or not.

However, in order not to limit the activation time of the clock signal CLK to before a specified time, the reset signal RST may be received like the waveform of the reset signal RST shown in FIG. 5.

Figure 7:
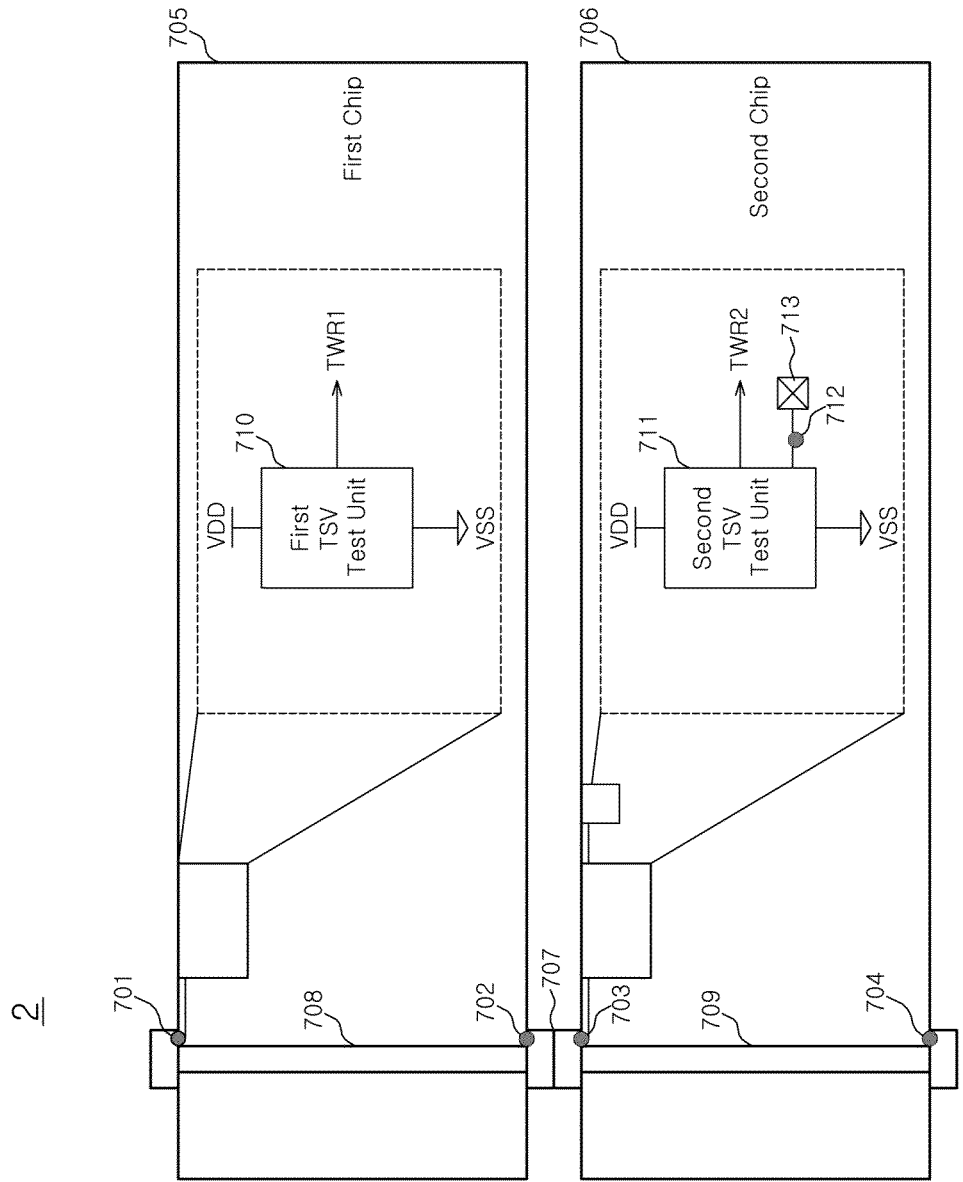
FIG. 7 is a schematic view illustrating an exemplary stacked semiconductor apparatus in accordance with another embodiment of the present invention.

FIG. 7 is a schematic view illustrating a stacked semiconductor apparatus in accordance with another embodiment of the present invention.

The stacked semiconductor apparatus 2 may include a first chip 705, a second chip 706, and a connection unit 707.

The first chip 705 includes a first TSV 708 formed between a first node 701 and a second node 702.

Also, the second chip 706 includes a second TSV 709 formed between a third node 703 and a fourth node 704.

The connection unit 707 is configured to electrically connect the second node 702 and the third node 703 with each other.

Figure 2:
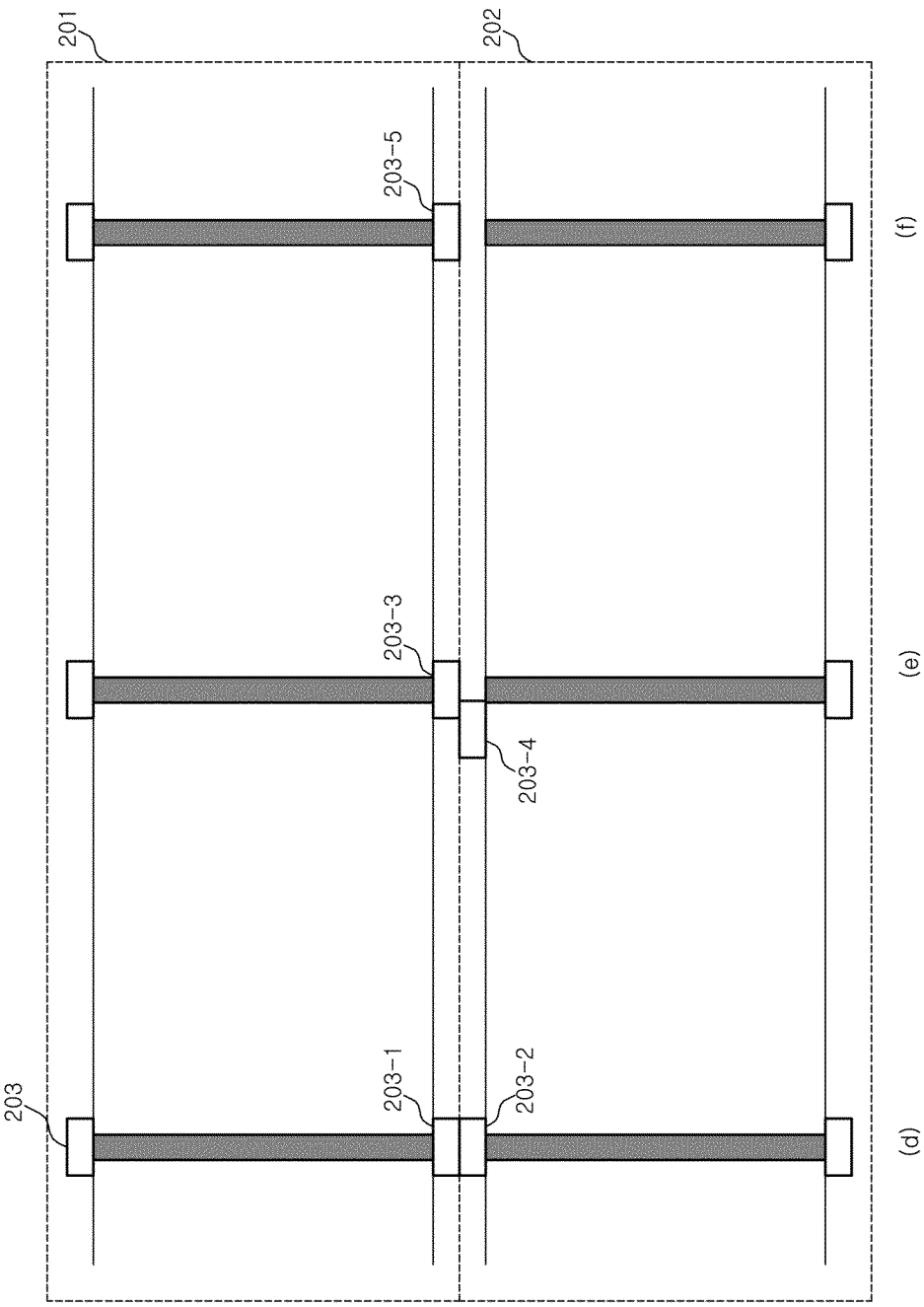
FIG. 2 is a schematic cross-sectional view explaining processing errors that may occur when connecting chips formed with TSVs.

As shown in FIG. 2, a semiconductor apparatus formed with TSVs may have bumps to be electrically connected with the TSVs. The connection unit 707 may include one or more bumps which are connected between the second node 702 and the third node 703.

FIG. 7 exemplifies that the connection unit 707 includes two bumps. However, it is to be noted that the number of bumps shown in FIG. 7 does not limit essential component parts and the numbers thereof in the embodiment of the present invention.

The first chip 705 may include a first TSV test unit 710.

The first TSV test unit 710 is configured to check the capacitance value of the first TSV 708, generate a first single TSV test result TWR1 in a single TSV test mode, and supply a power supply voltage VDD to the first node 701 in a stacked TSV test mode.

The single TSV test mode is a mode where the capacitance value of the first TSV 708 in the first chip 705 (or the second TSV 709 in the second chip 706) is checked and whether the first TSV 708 (or the second TSV 709) is normal is determined.

The single TSV test mode is suitable to be used before the first chip 705 and the second chip 706 are stacked (for example, at a wafer level).

The stacked TSV test mode is a mode where whether the first TSV 708 and the second TSV 709 are normally connected electrically with each other is checked. Without a limiting sense, FIG. 2 shows an example (d) in which two TSVs are normally connected with each other and examples (e) and (f) in which two TSVs are abnormally connected with each other.

The stacked TSV test mode is suitable to be used after the first chip 705 and the second chip 706 are stacked (for example, at a stack level).

By performing the stacked TSV test mode, it is possible to check whether or not the connection unit 707 is normally formed and whether or not the first TSV 708 and the second TSV 709 are electrically connected with each other with resistance values that allow them to appropriately communicate with each other.

In order to illustrate the connection between the first chip 705 and the second chip 706, FIG. 7 is given as a schematic cross-sectional view illustrating the first chip 705 and the second chip 706.

Therefore, in order to allow easy understanding of the first TSV test unit 710 and a second TSV test unit 711 shown in the cross-sectional view of FIG. 7, schematic plan views of the first TSV test unit 710 and the second TSV test unit 711 are given together.

The second chip 706 may include the second TSV test unit 711.

The second TSV test unit 711 is configured to check the capacitance value of the second TSV 709 and generate a second single TSV test result TWR2 in the single TSV test mode, and electrically connect the third node 703 and a fifth node 712 with each other in the stacked TSV test mode.

In the stacked semiconductor apparatus 2 configured in this way, before the first chip 705 and the second chip 706 are stacked, whether the first TSV 708 and the second TSV 709 in the respective chips 705 and 706 are normal may be checked through the single TSV test mode.

The single TSV test mode may be performed as in the semiconductor apparatus 1 in accordance with one embodiment of the present invention shown in FIGS. 3 to 6. Performing the single TSV test mode by the stacked semiconductor apparatus 2 will be described later in further detail.

In the stacked semiconductor apparatus 2, after the first chip 705 and the second chip 706 are stacked, whether the first TSV 708 and the second TSV 709 are normally connected electrically with each other may be checked through the stacked TSV test mode.

In the stacked TSV test mode, the first TSV test unit 710 supplies the power supply voltage VDD to the first node 701.

Also, in the stacked TSV test mode, the second TSV test unit 711 electrically connects the fifth node 712 and the third node 703 with each other.

Accordingly, in the stacked TSV test mode, an electrical path is formed from the power supply voltage VDD, through the first node 701, the first TSV 708, the connection unit 707, and the third node 703 to the fifth node 712.

In the stacked TSV test mode, by detecting the current flowing through the fifth node 712, the resistance value of the electrical path may be checked. The resistance value varies depending upon the state in which the connection unit 707 electrically connects the second node 702 and the third node 703 with each other. Thus, by performing the stacked TSV test mode, the stacked semiconductor apparatus 2 may be checked regarding whether the electrically connected state of the first TSV 708 and the second TSV 709 is normal.

In order to detect the current flow through the fifth node 712, the fifth node 712 may be connected with a predetermined pad 713 for communicating with an outside device.

A test equipment for testing a semiconductor apparatus in a stacked state may check the electrical connection states of the TSVs in the stacked semiconductor apparatus 2 by controlling the stacked semiconductor apparatus 2 to perform the stacked TSV test mode and checking current flow detected from the predetermined pad 713.

For example, a stacked semiconductor apparatus manufacturer may check whether the electrical connection states of the TSVs are normal and determine whether to perform a subsequent process. Therefore, since performing an unnecessary process for a failed stacked semiconductor apparatus is avoided, the manufacturing cost of a semiconductor apparatus may be reduced and the productivity may be improved.

In order to detect the current flow through the fifth node 712, the fifth node 712 may be connected with a current sensing circuit (not shown) provided to the second chip 706. The current sensing circuit may include a current sensing node which is generally known in the art to sense how much current flows through the fifth node 712. For example, the stacked semiconductor apparatus 2 may perform a repair operation for a corresponding TSV, by using a stacked TSV test result generated by the current sensing circuit depending upon an amount of current.

Figure 8:
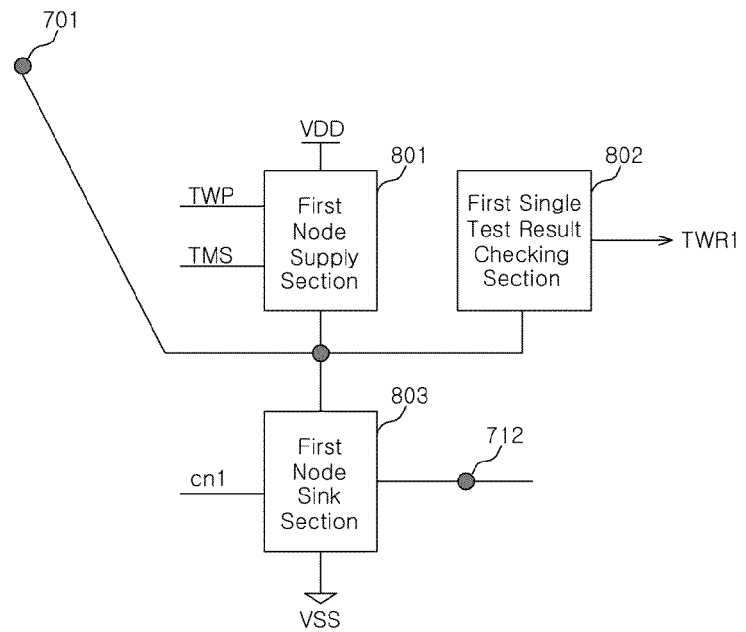
FIG. 8 is a block diagram illustrating an exemplary embodiment of the first TSV test unit shown in FIG. 7.

FIG. 8 is a block diagram illustrating an exemplary embodiment of the first TSV test unit 710 shown in FIG. 7.

The first TSV test unit 710 may include a first node supply section 801 and a first single test result checking section 802.

The first node supply section 801 is configured to supply the power supply voltage VDD to the first node 701 in response to a single test pulse signal TWP in the single TSV test mode and supply the power supply voltage VDD to the first node 701 in the stacked TSV test mode.

A configuration may be made such that the single TSV test mode or the stacked TSV test mode may be selected in response to a mode select signal TMS.

The mode select signal TMS is a signal for distinguishing the single TSV test mode and the stacked TSV test mode and may include a test mode signal.

The first single test result checking section 802 is configured to generate the first single TSV test result TWR1 depending upon the voltage level of the first node 701.

Like the charge node 404 shown in FIG. 4, the first node 701 has the capacitance component of the first TSV 708.

In the single TSV test mode, the first node supply section 801 charges the first node 701, which has the capacitance component of the first TSV 708, and changes the voltage level of the first node 701.

In the single TSV test mode, the first single test result checking section 802 generates the first single TSV test result TWR1 regarding whether the voltage level of the first node 701 is equal to or larger than a predetermined level.

Like the test pulse TWP shown in FIGS. 4 and 5, the single test pulse signal TWP may be configured as a pulse signal with a predetermined pulse width. The first node supply section 801 may supply a constant amount of charge to the first node 701, and the first single test result checking section 802 may check the value of the capacitance component of the first TSV 708 by detecting a change in the voltage level of the first node 701. The single test pulse signal TWP may be configured as the pulse signal with the predetermined pulse width to supply the constant amount of charge to the first node 701.

In response to the single test pulse signal TWP configured as the pulse signal with the predetermined pulse width, the first node supply section 801 charges the first node 701 for the duration of the predetermined pulse width. Due to this fact, the voltage level of the first node 701 is boosted.

In the case where the first TSV 708 is formed to meet a design standard as shown in (a) of FIG. 1, the voltage level of the first node 701, which is boosted for the predetermined pulse width by the first node supply section 801, may be lower than a preselected level like the charge node 404 shown in FIG. 5.

Moreover, as shown in FIG. 8, the first TSV test unit 710 may include a first node sink section 803 for initializing the voltage level of the first node 701.

The first node sink section 803 is configured to initialize the voltage level of the first node 701 in response to a first node control signal cn1.

The first node control signal cn1 may be configured in the same manner as the reset signal RST shown in FIGS. 4 and 5.

For example, the first node control signal cn1 may activate the first node sink section 803 during a period before the first node supply section 801 is activated, and initialize the first node 701 to a is low level.

Figure 9:
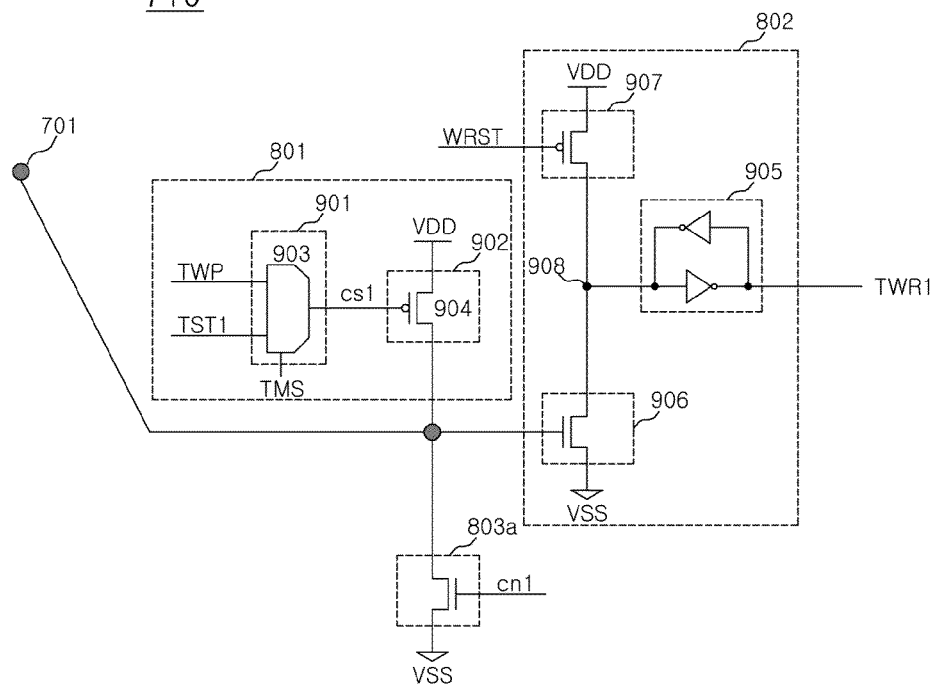
FIG. 9 is a circuit diagram illustrating an exemplary embodiment of the first TSV test unit shown in FIGS. 7 and 8.

FIG. 9 is a circuit diagram illustrating an exemplary embodiment of the first TSV test unit 710 shown in FIGS. 7 and 8.

As shown in FIG. 9, the first TSV test unit 710 may include the first node supply section 801 and the first single test result checking section 802.

The first node supply section 801 may include a first select stage 901 and a first switch stage 902.

The first select stage 901 is configured to select one of the single test pulse signal TWP and a stack test signal TST1 in response to the mode select signal TMS and output a first switch control signal cs1.

The first select stage 901 may include a MUX circuit 903.

The MUX circuit 903 may be configured as a general MUX circuit which selects and outputs one of the single test pulse signal TWP and the stack test signal TST1 in response to the mode select signal TMS.

The first switch stage 902 is configured to electrically connect the power supply voltage VDD and the first node 701 with each other in response to the first switch control signal cs1.

The first switch stage 902 may include a PMOS transistor 904.

The PMOS transistor 904 is connected between the power supply voltage VDD and the first node 701 and receives the first switch control signal cs1 through the gate terminal.

The stack test signal TST1 is a signal which allows the first switch stage 902 to form a current path from the power supply voltage VDD to the first node 701 in the stacked TSV test mode. The current path from the power supply voltage VDD to the first node 701 is connected with a current path from the third node 703 to the fifth node 712 which is formed by the second TSV test unit 711 as will be described later.

As described above, due to the fact that the current path from the power supply voltage VDD, through the first node 701, the second node 702, the connection unit 707, the third node 703 and the second TSV test unit 711, to the fifth node 712 is connected with the predetermined pad 713 or the current sensing circuit (not shown), an amount of current is sensed. Therefore, the stack test signal TST1 may be a signal which is activated sufficiently long enough to enable current sensing through the predetermined pad 713 or current sensing through the current sensing circuit from an outside.

For example, the stack test signal TST1 may use the ground voltage VSS. In this case, the first select stage 901 selects the stack test signal TST1, that is, the ground voltage VSS, as the first switch control signal cs1 in response to the mode select signal TMS, and accordingly, the first switch control signal cs1 may be a signal which is kept activated to a low level while the mode select signal TMS selects the stacked TSV test mode.

Thus, since the stack test signal TST1 may be realized not as a specific signal of which value varies but as a voltage with a preset level, it is to be noted that the stack test signal TST1 need not be a generated signal to configure the first node supply section 801. Therefore, the stack test signal TST1 is not shown in the first node supply section 801 shown in FIG. 8.

The first test result checking section 802 may include a latch stage 905 and a determination node sink stage 906.

The latch stage 905 is configured to be connected with a determination node 908 and latch the voltage level of the determination node 908.

The latch stage 905 may include a latch circuit which is generally known in the art.

The determination node sink stage 906 changes a discharging degree for the determination node 908, depending upon the voltage level of the first node 701.

The determination node sink stage 906 may be configured in the same manner as the determination node sink stage 406 shown in FIG. 4, and thus, the detailed description will be omitted herein.

The first test result checking section 802 may output the first single TSV test result TWR1 depending upon the latching value of the latch stage 905.

For example, as shown in FIG. 9, the latch stage 905 may latch the voltage level of the determination node 908, invert the voltage level of the determination node 908, and output the first single TSV test result TWR1.

The operations of the latch stage 905 and the determination node sink stage 906 may be configured to be the same as those of the determination node sink stage 406 and the signal output stage 407 shown in FIG. 4, and thus, the detailed description will be omitted.

The first test result checking section 802 may include a determination node supply stage 907 which is configured to initialize the voltage level of the determination node 908 in response to a determination node reset signal WRST.

The determination node supply stage 907 may be configured in the same manner as the determination node initialization stage 411 shown in FIG. 4, and thus, the detailed description will be omitted.

Figure 10:
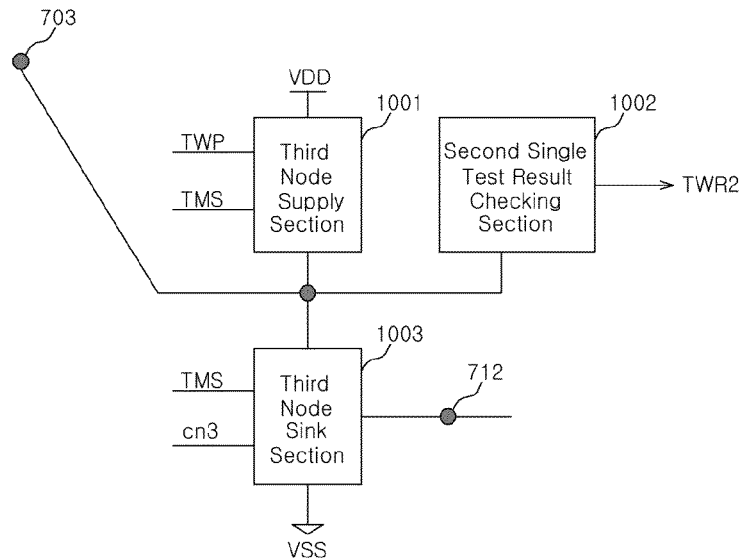
FIG. 10 is a block diagram illustrating an exemplary embodiment of the second TSV test unit shown in FIG. 7.

FIG. 10 is a block diagram illustrating an exemplary embodiment of the second TSV test unit 711 shown in FIG. 7.

The second TSV test unit 711 may include a third node supply section 1001, a second single test result checking section 1002, and a third node connecting section 1003.

The third node supply section 1001 is configured to supply the power supply voltage VDD to the third node 703 in response to the single test pulse signal TWP in the single TSV test mode.

The second single test result checking section 1002 is configured to generate the second single TSV test result TWR2 depending upon the voltage level of the third node 703.

The third node connecting section 1003 is configured to electrically connect the third node 703 and the fifth node 712 with each other in the stacked TSV test mode.

Like the charge node 404 shown in FIG. 4, the third node 703 has the capacitance component of the second TSV 709.

In the single TSV test mode, the third node supply section 1001 charges the third node 703 that has the capacitance component of the second TSV 709 and thereby changes the voltage level of the third node 703.

In the single TSV test mode, the second single test result checking section 1002 generates the second single TSV test result TWR2 regarding whether the voltage level of the third node 703 is equal to or larger than a predetermined level.

The single test pulse signal TWP and the mode select signal TMS may be used as the same signals as the single test pulse signal TWP and the mode select signal TMS shown in FIGS. 8 and 9.

In response to the single test pulse signal TWP configured as the pulse signal with the predetermined pulse width, the third node supply section 1001 charges the third node 703 for the predetermined pulse width. Due to this fact, the voltage level of the third node 703 is boosted.

In the case where the second TSV 709 is formed to meet a design standard as shown in (a) of FIG. 1, the voltage level of the third node 703, which is boosted for the predetermined pulse width by the third node supply section 1001, may be lower than a preselected level like the charge node 404 shown in FIG. 5.

As described above, in the stacked TSV test mode, the third node connecting section 1003 electrically connects the third node 703 and the fifth node 712 with each other.

Due to this fact, since a current path is formed from the third node 703 to the fifth node 712 by the second TSV test unit 711, in the case where the current path is formed from the power supply voltage VDD to the second node 702 by the first TSV test unit 710, a current path may be formed from the power supply voltage VDD, through the first TSV 708, the connection unit 707, and the second TSV test unit 711 to the fifth node 712.

The third node connecting section 1003 may include a simple switch circuit.

The third node connecting section 1003 may be configured not only to electrically connect the third node 703 and the fifth node 712 with each other in the stacked TSV test mode but also to additionally perform an operation of initializing the voltage level of the third node 703 in the single TSV test mode.

Figure 11:
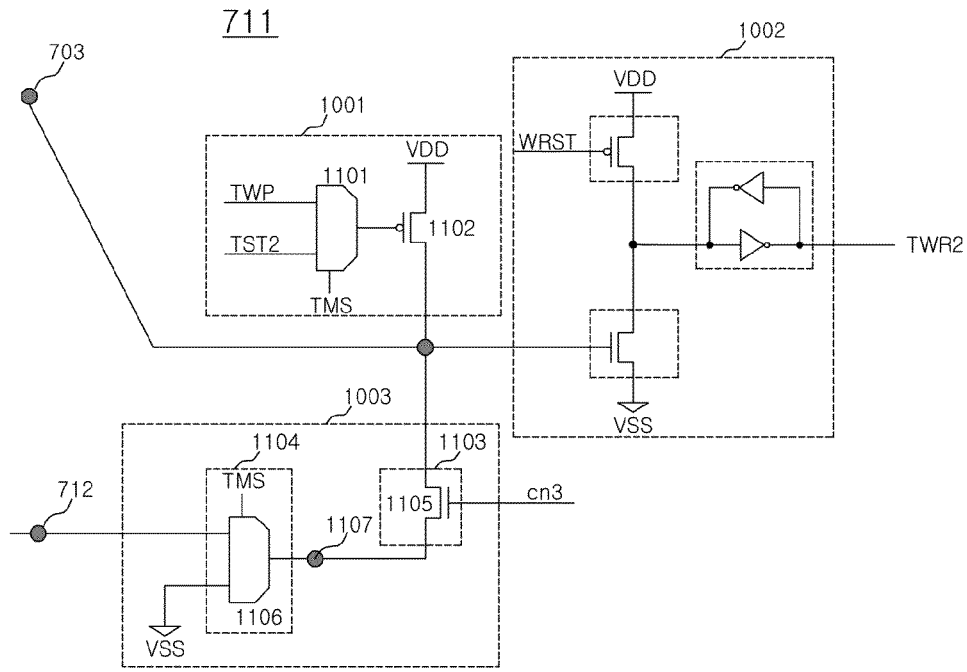
FIG. 11 is a circuit diagram illustrating an exemplary embodiment of the second TSV test unit shown in FIGS. 7 and 10.

FIG. 11 is a circuit diagram illustrating an exemplary embodiment of the second TSV test unit 711 shown in FIGS. 7 and 10.

The second TSV test unit 711 shown in FIG. 11 is configured to include the third node supply section 1001, the second single test result checking section 1002, and the third node connecting section 1003.

The third node supply section 1001 may include a MUX circuit 1101 and a PMOS transistor 1102.

The MUX circuit 1101 is configured to select and output one of the single test pulse signal TWP and a stack test signal TST2 in response to the mode select signal TMS.

The PMOS transistor 1102 is connected between the power supply voltage VDD and the third node 703 and receives the output of the MUX circuit 1101 through the gate terminal.

The third node supply section 1001 configured in this way may charge the third node 703 during the pulse width of the single test pulse signal TWP by selecting the single test pulse signal TWP and providing the single test pulse signal TWP to the PMOS transistor 1102 when the mode select signal TMS indicates the single TSV test mode.

Also, when the mode select signal TMS indicates the stacked TSV test mode, the third node supply section 1001 blocks the current path from the power supply voltage VDD to the third node 703 by providing the stack test signal TST2 to the PMOS transistor 1102 and turning off the PMOS transistor 1102.

For such an operation, the stack test signal TST2 may have a sufficiently long high level value. For example, the stack test signal TST2 may include the power supply voltage VDD.

Since the stack test signal TST2 may be realized like the stack test signal TST1 not generated as a specific signal whose value varies but as a voltage with a preset level, it is to be noted that the stack test signal TST2 does not need to be input to the third node supply section 1001. Therefore, the stack test signal TST2 is not shown in the third node supply section 1001 shown in FIG. 10.

The second single test result checking section 1002 may be configured similarly to the test result checking section 403 shown in FIG. 4 and the first single test result checking section 802 shown in FIG. 9, and operate in the same manner as them. Thus, the detailed description will be omitted.

The third node connecting section 1003 may include a second switch stage 1103 and a second select stage 1104.

The second switch stage 1103 is configured to electrically connect the third node 703 and a sixth node 1107 with each other in response to a third node control signal cn3.

The second switch stage 1103 may include an NMOS transistor 1105.

The NMOS transistor 1105 is connected between the third node 703 and the sixth node 1107 and receives the third node control signal cn3 through the gate terminal.

The second select stage 1104 is configured to electrically connect one of the fifth node 712 and the ground voltage VSS with the sixth node 1107 in response to the mode select signal TMS.

The second select stage 1104 may include a MUX circuit 1106.

The MUX circuit 1106 electrically connects one of the fifth node 712 and the ground voltage VSS with the sixth node 1107 in response to the mode select signal TMS.

The third node connecting section 1003 configured in this way electrically connects the third node 703 and the fifth node 712 is with each other in response to the third node control signal cn3 when the mode select signal TMS indicates the stacked TSV test mode. According to this fact, a current path is formed from the power supply voltage VDD, through the first TSV test unit 710, the first TSV 708, the connection unit 707, and the third node 703 to the fifth node 712.

Also, the third node connecting section 1003 electrically connects the third node 703 and the ground voltage VSS with each other in response to the third node control signal cn3 when the mode select signal TMS indicates the single TSV test mode. According to this fact, the third node 703 is discharged and is initialized to a low level.

Figure 12:
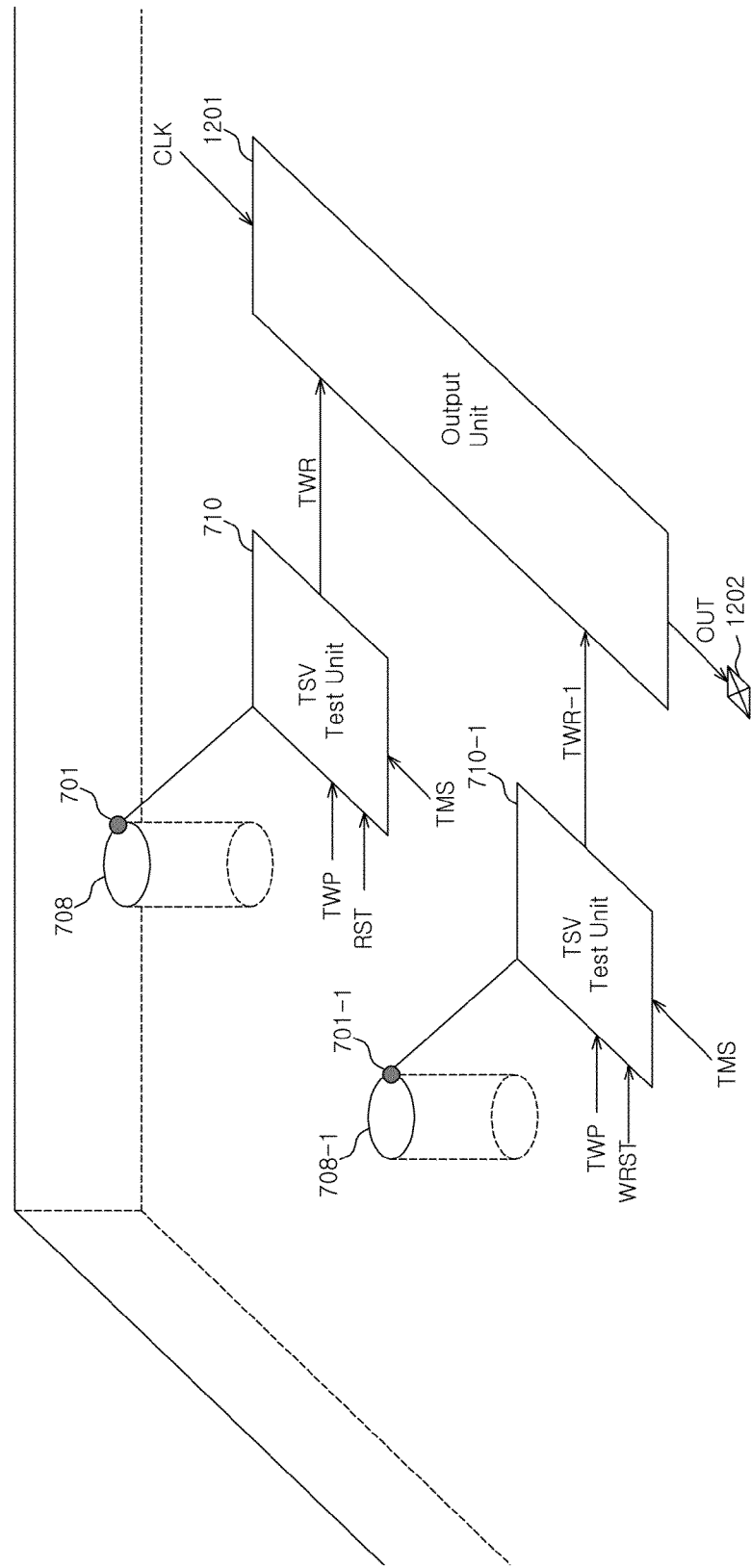
FIG. 12 is a block diagram illustrating an exemplary embodiment of the first chip shown in FIG. 7.

FIG. 12 is a block diagram illustrating an exemplary embodiment of the first chip 705 shown in FIG. 7.

While it is illustrated for the sake of convenience in explanation that each of the first chip 705 and the second chip 706 shown in FIG. 7 has one TSV, this is not to limit the number of TSVs in each chip in any embodiment of the present invention.

Each chip of the stacked semiconductor apparatus 2 may include a plurality of TSVs and TSV test units allocated to the respective TSVs.

In FIG. 12, it is exemplified that the first chip 705 includes two TSVs 708 and 708-1 and TSV test units 710 and 710-1 allocated to the respective TSVs 708 and 708-1. Accordingly, the two TSV test units 710 and 710-1 output two single TSV test results TWR1 and TWR1-1.

The two TSVs 708 and 708-1 may include the first TSV 708 shown in FIG. 7 and another TSV.

The two TSV test units 710 and 710-1 may include the first TSV test unit 710 shown in FIG. 7 and another TSV test unit.

The TSV 708 and the TSV 708-1 may have the same structure and are presented as the TSV 708 and the TSV 708-1 for the sake of distinction in explanation.

The TSV test unit 710 and the TSV test unit 710-1 may have the same structure and are presented as the TSV test unit 710 and the TSV test unit 710-1 for the sake of distinction in explanation.

Hence, the first single TSV test results TWR1 and TWR1-1 outputted from the two TSV test units 710 and 710-1 are presented as the single TSV test result TWR1 and the single TSV test result TWR1-1 for the sake of distinction in explanation.

As shown in FIG. 12, the first chip 705 may include an output unit 1201.

The output unit 1201 may receive and latch the plurality of single TSV test results TWR1 and TWR1-1 outputted from the plurality of TSV test units 710 and 710-1, and serially output the plurality of single TSV test results TWR1 and TWR1-1 in response to the clock signal CLK.

Similar to the fact that the semiconductor apparatus 1 shown in FIG. 3 may include the predetermined pad 304, the first chip 705 may further include a predetermined pad 1202 for outputting an output signal OUT of the output unit 1201 to an is external device or to a current sensing circuit (not shown).

Figure 13:
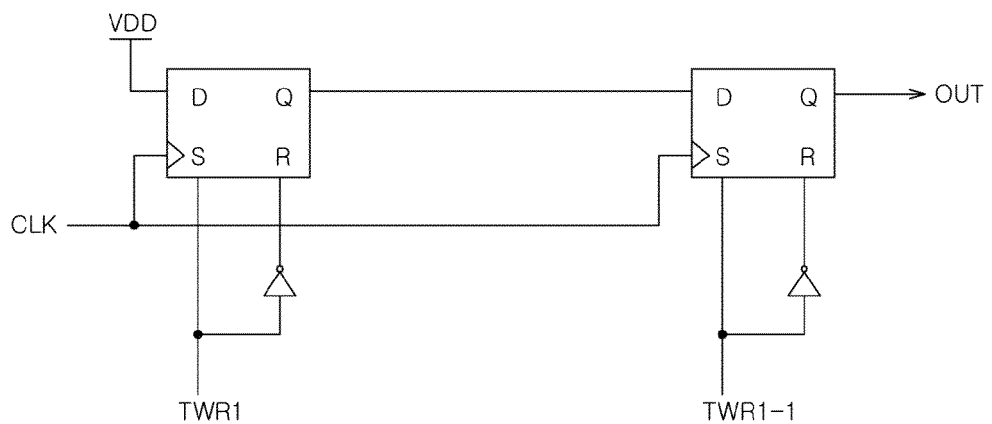
FIG. 13 is a circuit diagram illustrating an exemplary embodiment of the output unit shown in FIG. 12.

FIG. 13 is a circuit diagram illustrating an exemplary embodiment of the output unit 1201 shown in FIG. 12.

As shown in FIG. 13, the output unit 1201 may include a plurality of flip-flops connected in series and respectively receive the plurality of single TSV test results TWR1 and TWR1-1.

The output unit 1201 shown in FIG. 13 is configured and operates according to the same principle as the output unit 303 shown in FIG. 6.

Figure 14:
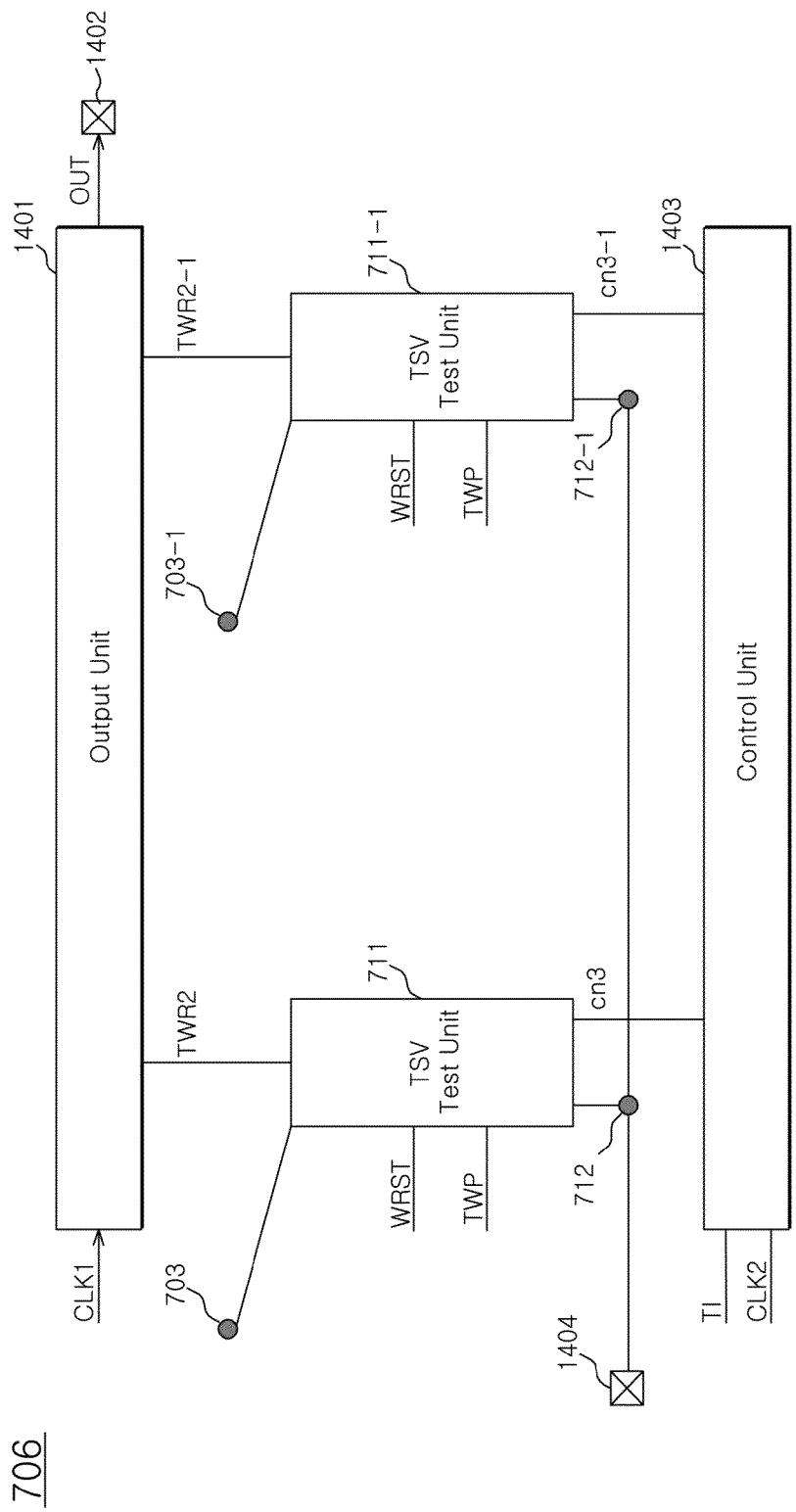
FIG. 14 is a block diagram illustrating an exemplary embodiment of the second chip shown in FIG. 7.

FIG. 14 is a block diagram illustrating an exemplary embodiment of the second chip 706 shown in FIG. 7.

Like the plurality of TSVs 708 and 708-1 and the plurality of TSV test units 710 and 710-1 respectively allocated to the plurality of TSVs 708 and 708-1, the second chip 706 is configured to include a plurality of TSVs (not shown) and a plurality of TSV test units 711 and 711-1 respectively allocated to the plurality of TSVs.

In FIG. 14, it is exemplified without a limiting sense that the second chip 706 includes two TSVs (not shown) and two TSV test units 711 and 711-1 respectively allocated to the two TSVs.

The two TSVs may be configured in the same manner as the second TSV 709 shown in FIG. 7.

The two TSV test units 711 and 711-1 may be configured in the same manner as the second TSV test unit 711 shown in FIG. 7.

For the sake of distinction in explanation, the nodes connected with the two TSVs are presented as a third node 703 and a third node 703-1.

Also, the two TSV test units are presented as the TSV test unit 711 and the TSV test unit 711-1.

Due to this fact, the two TSV test units 711 and 711-1 respectively receive different third node control signals, which are presented as a third node control signal cn3 and a third node control signal cn3-1.

Further, the two TSV test units 711 and 711-1 respectively output different second single TSV test results, which are presented as a single TSV test result TWR2 and a single TSV test result TWR2-1.

Fifth nodes, which are to be electrically connected with the third nodes 703 and 703-1 by the two TSV test units 711 and 711-1 under the stacked TSV test mode, are presented as a fifth node 712 and a fifth node 712-1.

The second chip 706 may include an output unit 1401 as shown in FIG. 14.

The output unit 1401 is configured to receive and latch the plurality of single TSV test results TWR2 and TWR2-1 including the second single TSV test result TWR2, which are outputted from the plurality of TSV test units 711 and 711-1, and serially output the plurality of single TSV test results TWR2 and TWR2-1 as an output signal OUT in response to the clock signal CLK.

The output unit 1401 may be configured and operate in the same manner as the output unit 1201 shown in FIG. 13. Thus, the detailed description will be omitted.

In the same manner as the semiconductor apparatus 1 shown in FIG. 3 includes the predetermined pad 304 and the first chip 705 shown in FIG. 12 includes the predetermined pad 1202, the second chip 706 may include a predetermined pad 1402 for outputting the output signal OUT of the output unit 1401 to an external device or a current sensing circuit (not shown).

As described above, the second TSV test unit 711 shown in FIG. 7 electrically connects the third node 703 and the fifth node 712 with each other. Also, the second chip 706 may further include the predetermined pad 713 electrically connected with the fifth node 712, so that current flowing through the fifth node 712 may be sensed by an external device.

As the second chip 706 is configured to include the plurality of TSVs and the plurality of TSV test units 711 and 711-1 as shown in FIG. 14, the second chip 706 may include predetermined pads electrically connected with the fifth nodes 712 and 712-1 electrically connected with the plurality of TSV test units 711 and 711-1, to allow current flowing through the fifth nodes 712 and 712-1 to be sensed by an external device.

However, since a pad occupies a relatively large area in a semiconductor apparatus, an area necessary for constructing the stacked semiconductor apparatus 2 may increase when the second chip 706 is configured to be connected with two different pads electrically connected with the two fifth nodes 712 and 712-1.

Therefore, as shown in FIG. 14, it is advantageous in terms of high integration of the stacked semiconductor apparatus 2 that the fifth nodes 712 and 712-1 in the second chip 706 share a predetermined pad 1404.

In order for the plurality of TSV test units 711 and 711-1 to share the predetermined pad 1404 in the stacked TSV test mode, the plurality of TSV test units 711 and 711-1 may be sequentially activated one by one in the stacked TSV test mode. This is because, if the plurality of TSV test units 711 and 711-1 are simultaneously activated, current flowing from the third node 703, through the TSV test unit 711 and the fifth node 712, to the predetermined pad 1404, and current flowing from the third node 703-1, through the TSV test unit 711-1 and the fifth node 712-1, to the predetermined pad 1404 are simultaneously supplied to the predetermined pad 1404.

Hence, the third node control signals cn3 and cn3-1 may be controlled such that the plurality of TSV test units 711 and 711-1 sharing the predetermined pad 1404 in the stacked TSV test mode can easily perform the stacked TSV test mode and such that the plurality of TSV test units 711 and 711-1 can initialize the third nodes 703 and 703-1 in the single TSV test mode.

To this end, as shown in FIG. 14, the second chip 706 may be configured to further include a control unit 1403.

The control unit 1403 is configured to receive a test input signal TI which is serially inputted in response to a clock signal CLK2, generate the plurality of third node control signals cn3 and cn3-1, and provide them to the plurality of TSV test units 711 and 711-1.

Figure 15:
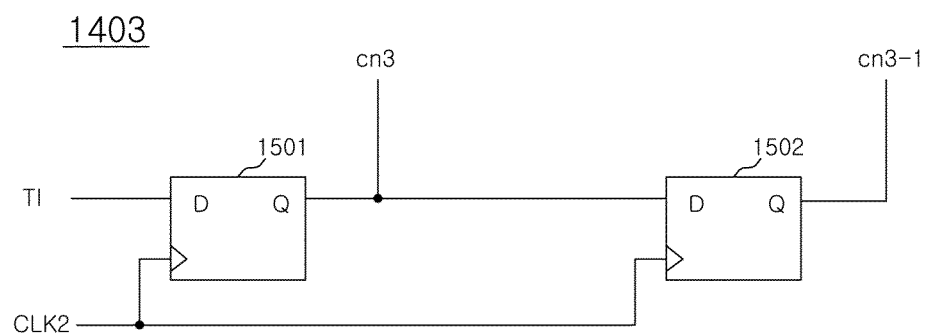
FIG. 15 is a circuit diagram illustrating an exemplary embodiment of the control unit shown in FIG. 14.

FIG. 15 is a circuit diagram illustrating an exemplary embodiment of the control unit 1403 shown in FIG. 14.

As shown in FIG. 15, the control unit 1403 may include a plurality of flip-flops 1501 and 1502 connected in series.

The plurality of flip-flops 1501 and 1502 are configured to receive and latch the test input signal TI in synchronization with the clock signal CLK2.

The latched values of the plurality of flip-flops 1501 and 1502 are provided to the plurality of TSV test units 711 and 711-1, which are different from each other, as the third node control signals cn3 and cn3-1.

The test input signal TI may include a test mode signal.

The clock signal CLK2 may include a test mode signal.

FIG. 14 shows the clock signal CLK1 and the clock signal CLK2.

The clock signal CLK1 is a signal which toggles to allow the output unit 1401 to output the plurality of single TSV test results TWR2 and TWR2-1 in the single TSV test mode, and the clock signal CLK2 is a signal which toggles to allow the control unit 1403 to generate the third node control signals cn3 and cn3-1 in the stacked TSV test mode and the single TSV test mode.

In detail, in the single TSV test mode, the clock signal CLK2 toggles to initialize the third nodes 703 and 703-1.

Thereafter, the TSV test units 711 and 711-1 charge the initialized third nodes 703 and 703-1 with a predetermined pulse width, and generate the single TSV test results TWR2 and TWR2-1 according to the voltage levels of the third nodes 703 and 703-1.

Then, the clock signal CLK1 toggles to allow the output unit 1401 to output the plurality of single TSV test results TWR2 and TWR2-1.

Therefore, the clock signal CLK2 and the clock signal CLK1 are signals which toggle at different times. Hence, even when the clock signal CLK2 and the clock signal CLK1 are configured using the same signals, no collision occurs when the second chip 706 performs the single TSV test mode and the stacked TSV test mode.

While the clock signals CLK1 and CLK2 are shown in FIGS. 14 and 15 as different signals to indicate that they toggle for different operations, it is conceivable that the clock signals CLK1 and CLK2 may be configured using the same signals. It is to be noted that the clock signals CLK1 and CLK2 shown in FIGS. 14 and 15 do not limit the number of clock signals needed in any embodiment of the present invention to 2 or more.

The first chip 705 and the second chip 706 shown in FIGS. 7 to 15 perform the same operation in the single TSV test mode. For example, in the single TSV test mode, the first chip 705 and the second chip 706 perform operations for checking the values of the capacitance component of the TSVs in them and generating the single TSV test results TWR1, TWR1-1, TWR2, and TWR2-1.

Unlike this, the first chip 705 and the second chip 706 shown in FIGS. 7 to 15 perform different operations in the stacked TSV test mode. For example, in the stacked TSV test mode, the first chip 705 supplies the power supply voltage VDD to the first nodes 701 and 701-1, and the second chip 706 electrically connects the fifth nodes 712 and 712-1 with the third nodes 703 and 703-1.

Since the first chip 705 and the second chip 706 perform different operations in the stacked TSV test mode, they may be manufactured through different manufacturing processes that are differently designed.

Also, although the first chip 705 and the second chip 706 are manufactured through the same manufacturing processes designed in the same way, they may perform different operations in the stacked TSV test mode.

In a stacked semiconductor apparatus manufactured by stacking a plurality of same chips configured according to an embodiment of the present invention, by providing different signals to the respective chips, the plurality of chips may be configured to operate as the first chip 705 and the second chip 706.

When a stacked semiconductor apparatus is manufactured by stacking a plurality of chips manufactured through the same manufacturing processes, substantial advantages are provided in terms of a cost aspect such as distribution administration, design administration and production administration and a performance aspect such as characteristic administration and process variation administration when compared to the case where a stacked semiconductor apparatus is manufactured by stacking a plurality of is chips manufactured through different manufacturing processes.

In the stacked semiconductor apparatus 2 shown in FIG. 7, if the first TSV test unit 710 in the first chip 705 and the second TSV test unit 711 in the second chip 706 are configured using the same circuits, the stacked semiconductor apparatus 2 may serve as a stacked semiconductor apparatus manufactured through stacking a plurality of chips manufactured using the same manufacturing processes.

Figure 16:
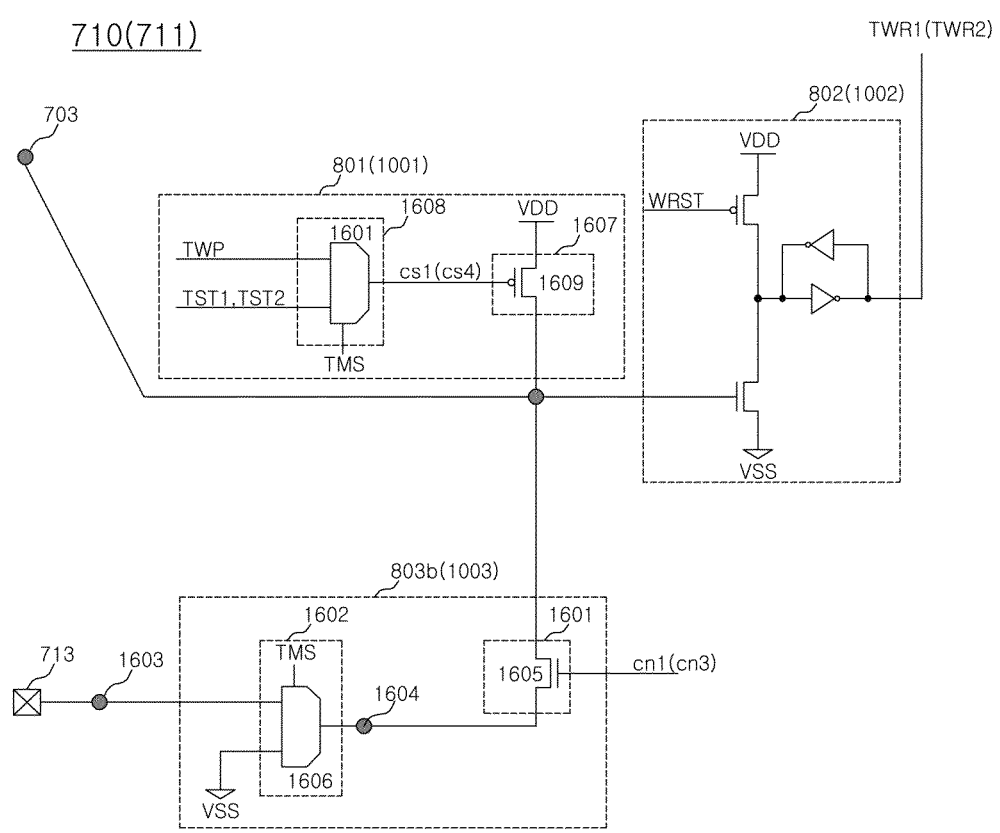
FIG. 16 is a circuit diagram illustrating an exemplary semiconductor apparatus capable of operating as both the first TSV test unit and the second TSV test unit shown in FIG. 7.

FIG. 16 is a circuit diagram illustrating a semiconductor apparatus capable of operating as both the first TSV test unit 710 and the second TSV test unit 711 shown in FIG. 7.

For the sake of easy understanding, in FIG. 16, as can be readily seen from the reference numeral 710 (711), each component element is designated such that a reference numeral corresponding to the first TSV test unit 710 is presented without using parentheses and a reference numeral corresponding to the second TSV test unit 711 is presented in parentheses.

Like the first TSV test unit 710 shown in FIG. 8, the first TSV test unit 710 shown in FIG. 16 is configured to include the first node supply section 801, the first single test result checking section 802, and the first node sink section 803b.

The first node supply section 801 shown in FIG. 16 is configured in the same manner as the first node supply section 801 shown in FIG. 9, and may receive the same signal. Thus, the detailed description will be omitted.

The first single test result checking section 802 shown in FIG. 16 is configured in the same manner as the first single test result checking section 802 shown in FIG. 9, and may receive and output the same signal. Thus, the detailed description will be omitted.

The first node sink section 803b shown in FIG. 16 may include a third switch stage 1601 and a third select stage 1602.

The third switch stage 1601 is configured to electrically connect the first node 701 and an eighth node 1604 with each other in response to the first node control signal cn1.

The third switch stage 1601 may include an NMOS transistor 1605. The NMOS transistor 1605 is connected between the first node 701 and the eighth node 1604 and receives the first node control signal cn1 through the gate terminal thereof.

The third select stage 1602 is configured to electrically connect one of a seventh node 1603 and the ground voltage VSS with the eighth node 1604 in response to the mode select signal TMS.

The third select stage 1602 may include a MUX circuit 1606.

The MUX circuit 1606 electrically connects one of the seventh node 1603 and the ground voltage VSS with the eighth node 1604 in response to the mode select signal TMS.

As mentioned, the first node sink section 803 performs an operation of initializing the first node 701 in response to the first node control signal cn1 in the single TSV test mode.

Also, in the stacked TSV test mode, since the first TSV test unit 710 forms a current path from the power supply voltage VDD to the first node 701 by supplying the power supply voltage VDD to the first node 701, the first node sink section 803 may be deactivated in the stacked TSV test mode.

In order to allow the first node sink section 803b shown in FIG. 16 to perform the above-described operation, the first node control signal cn1 may be maintained in a deactivated state at a low level in the stacked TSV test mode.

Furthermore, the predetermined pad 713 shown in FIG. 7 may be connected with the seventh node 1603 of the first chip 705. However, even when the predetermined pad 713 is electrically connected with the eighth node 1604 through the seventh node 1603 in response to the mode select signal TMS which indicates the stacked TSV test mode, since the first node control signal cn1 is maintained in the deactivated state in the stacked TSV test mode, the predetermined pad 713 may not exert any influence on the operation of the first node sink section 803b.

Like the second TSV test unit 711 shown in FIG. 10, the second TSV test unit 711 shown in FIG. 16 is configured to include the third node supply section 1001, the second single test result checking section 1002, and the third node connecting section 1003.

The third node supply section 1001 shown in FIG. 16 may include a fourth switch stage 1607 and a fourth select stage 1608.

The fourth switch stage 1607 is configured to electrically connect the power supply voltage VDD and the third node 703 with each other in response to a fourth switch control signal cs4.

The fourth switch stage 1607 may include a PMOS transistor 1609. The PMOS transistor 1609 is connected between the power supply voltage VDD and the third node 703 and receives the fourth switch control signal cs4 through the gate terminal thereof.

The fourth select stage 1608 outputs one of the single test pulse signal TWP and the stack test signal TST2 as the fourth switch control signal cs4 in response to the mode select signal TMS.

The fourth select stage 1608 may include a MUX circuit 1601.

As mentioned, the third node supply section 1001 performs an operation of charging the third node 703 in response to the single test pulse signal TWP in the single TSV test mode.

Also, in the stacked TSV test mode, since the second TSV test unit 711 should be electrically connected with the fifth node 712 and the third node 703 and form a current path from the third node 703 to the fifth node 712, the third node supply section 1001 may be deactivated in the stacked TSV test mode.

In order to allow the third node supply section 1001 shown in FIG. 16 to perform the above-described operation, the stack test signal TST2 may be maintained in a deactivated state as a high level in the stacked TSV test mode.

The second single test result checking section 1002 shown in FIG. 16 is configured in the same manner as the second single test result checking section 1002 shown in FIG. 11, and may receive and output the same signal. Thus, the detailed description will be omitted.

The third node connecting section 1003 shown in FIG. 16 is configured in the same manner as the third node connecting section 1003 shown in FIG. 11, and may receive and output the same signal. Thus, the detailed description will be omitted.

The stacked semiconductor apparatus 2 shown in FIGS. 7 to 16 is exemplified as having two chips 705 and 706.

However, this is only for the sake of convenience in explanation, and therefore, the present invention may be applied to a stacked semiconductor apparatus constructed by stacking three or more chips.

For example, in a stacked semiconductor apparatus constructed by stacking five chips, when an uppermost chip is configured like the first chip 705 and a lowermost chip is configured like the second chip 706, it is possible to check the electrical connection states of a plurality of TSVs in the five chips.

While certain embodiments have been described above, it will be understood to those skilled in the art that the embodiments described are by way of example only. Accordingly, the semiconductor apparatus and the stacked semiconductor apparatus described herein should not be limited based on the described embodiments. Rather, the semiconductor apparatus and the stacked semiconductor apparatus described herein should only be limited in light of the claims that follow when taken in conjunction with the above description and accompanying drawings.

What is claimed:

1. A stacked semiconductor apparatus comprising:
a first chip having a first TSV connected between a first node and a second node;
a second chip having a second TSV connected between a third node and a fourth node; and
a connection unit configured to electrically connect the second node and the third node with each other,
wherein the first chip includes a first TSV test unit configured to check a capacitance value of the first TSV and generate a first single test result in a single TSV test mode, and supply a power supply voltage to the first node in a stacked TSV test mode, and wherein the second chip includes a second TSV test unit configured to check a capacitance value of the second TSV and is generate a second single test result in the single TSV test mode, and electrically connect the third node and a fifth node with each other in the stacked TSV test mode.

2. The stacked semiconductor apparatus according to claim 1, wherein the first TSV test unit comprises:
a first node supply section configured to supply the power supply voltage to the first node in response to a single test pulse signal in the single TSV test mode, and supply the power supply voltage to the first node in the stacked TSV test mode; and
a first single test result checking section configured to generate the first single test result depending upon a voltage level of the first node.

3. The stacked semiconductor apparatus according to claim 2, wherein the first TSV test unit further comprises:
a first node sink section configured to initialize the voltage level of the first node in response to a first node control signal in the single TSV test mode.

4. The stacked semiconductor apparatus according to claim 2,
wherein the single test pulse signal is a signal activated with a predetermined pulse width, and
wherein, in the single TSV test mode, the first node is charged by the first node supply section for the predetermined pulse width.

5. The stacked semiconductor apparatus according to claim 4, wherein the first single test result checking section generates as the first single test result whether a voltage of the first node is equal to or larger than a predetermined level.

6. The stacked semiconductor apparatus according to claim 5, wherein the first single test result checking section comprises:
a latch stage connected with a determination node and configured to latch a voltage level of the determination node; and
a determination node sink stage configured to discharge the determination node depending upon the voltage level of the first node,
wherein the first single test result is generated depending upon a latched value of the latch stage.

7. The stacked semiconductor apparatus according to claim 6, wherein, when the voltage of the first node is equal to or larger than the predetermined level, the determination node is sufficiently discharged to change the latched value of the latch stage.

8. The stacked semiconductor apparatus according to claim 7, wherein the first single test result checking section further comprises:
a determination node supply stage configured to initialize the voltage of the determination node in response to a determination node reset signal.

9. The stacked semiconductor apparatus according to claim 2, wherein the first node supply section comprises:
a first switch stage configured to electrically connect the power supply voltage and the first node with each other in response to a first switch control signal; and
a first select stage configured to select one of the single test pulse signal and a stack test signal as the first switch control signal in response to a mode select signal,
wherein the mode select signal is a signal with different values in the single TSV test mode and the stacked TSV test mode, and
wherein the stack test signal is a signal which is activated in the stacked TSV test mode.

10. The stacked semiconductor apparatus according to claim 1, wherein the second TSV test unit comprises:
a third node supply section configured to supply the power supply voltage to the third node in response to a single test pulse signal in the single TSV test mode;
a third node connecting section configured to electrically connect the third node and the fifth node with each other in the stacked TSV test mode; and
a second single test result checking section configured to generate the second single test result depending upon a voltage level of the third node.

11. The stacked semiconductor apparatus according to claim 10, wherein the third node connecting section initializes the voltage level of the third node in the single TSV test mode.

12. The stacked semiconductor apparatus according to claim 11, wherein the third node connecting section comprises:
a second switch stage configured to electrically connect the third node and a sixth node with each other in response to a third node control signal; and
a second select stage configured to electrically connect one of the fifth node and a ground voltage with the sixth node in response to a mode select signal,
wherein the mode select signal has different values in the single TSV test mode and the stacked TSV test mode.

13. The stacked semiconductor apparatus according to claim 10, wherein the fifth node is electrically connected with a pad for communicating with an external device.

14. The stacked semiconductor apparatus according to claim 10,
wherein the single test pulse signal is a signal activated with a predetermined pulse width, and
wherein, in the single TSV test mode, the third node is charged by the third node supply section for the predetermined pulse width.

15. The stacked semiconductor apparatus according to claim 14, wherein the second single test result checking section indicates with the second single test result whether a voltage of the third node is equal to or larger than a predetermined level.

16. The stacked semiconductor apparatus according to claim 15, wherein the second single test result checking section comprises:
a latch stage connected with a determination node and configured to latch a voltage level of the determination node; and
a determination node sink stage configured to discharging the determination node depending upon the voltage level of the third node,
wherein the second single test result is generated depending upon a latched value of the latch stage.

17. The stacked semiconductor apparatus according to claim 15, wherein, when the voltage of the third node is equal to or larger than the predetermined level, a degree to which the determination node sink stage discharges the determination node is sufficiently large to change the latched value of the latch stage.

18. The stacked semiconductor apparatus according to claim 17, wherein the second single test result checking section further comprises:
a determination node supply stage configured to initialize the voltage of the determination node in response to a determination node reset signal.

19. The stacked semiconductor apparatus according to claim 2,
wherein the first chip and the second chip are manufactured through same manufacturing processes, and
wherein the first TSV test unit further comprises:
a first node sink section configured to initialize the voltage level of the first node in response to a first node control signal in the single TSV test mode, wherein the first node sink section comprises:
a third switch stage configured to electrically connect the first node and an eighth node with each other in response to the first node control signal; and
a third select stage configured to electrically connect one of a seventh node and the ground voltage with the eighth node in response to a mode select signal.

20. The stacked semiconductor apparatus according to claim 19, wherein the first node control signal is inputted to maintain a deactivated state in the stacked TSV test mode.

21. The stacked semiconductor apparatus according to claim 19, wherein the seventh node is electrically connected with a pad for communicating with an external device.

22. The stacked semiconductor apparatus according to claim 10,
wherein the first chip and the second chip are manufactured through the same manufacturing processes, and
wherein the third node supply section comprises:
a fourth switch stage configured to electrically connect the power supply voltage and the third node with each other in response to a fourth switch control signal; and
a fourth select stage configured to select one of the single test pulse signal and a stack test signal in response to a mode select signal and output the fourth switch control signal,
wherein the mode select signal is a signal that has different values in the single TSV test mode and the stacked TSV test mode, and
wherein the stack test signal is a signal that is deactivated in the stacked TSV test mode.

23. The stacked semiconductor apparatus according to claim 10,
wherein the second chip further comprises:
a current sensing circuit configured to check amount of current through the fifth node, and
wherein the current sensing circuit generates a stack test result depending upon the amount of current.

24. The stacked semiconductor apparatus according to claim 12, wherein the second chip comprises:
a plurality of TSVs including the second TSV; and
a plurality of TSV test units each allocated to at least two of the plurality of TSVs and configured in the same manner as the second TSV test unit.

25. The stacked semiconductor apparatus according to claim 24, wherein the second chip further comprises:
a third node control signal generation unit configured to receive a test input signal serially inputted in response to a clock signal, generate a plurality of third node control signals, and provide the plurality of third node control signals to the plurality of TSV test units.

26. The stacked semiconductor apparatus according to claim 25,
wherein the third node control signal generation unit includes a plurality of flip-flops,
wherein the plurality of flip-flops are configured to receive and latch the test input signal in synchronization with the clock signal, and
wherein latched values of the plurality of flip-flops are provided to the plurality of TSV test units as the third node control signals.

27. The stacked semiconductor apparatus according to claim 1, wherein the first chip comprises:
- a plurality of TSVs including the first TSV; and
- a plurality of TSV test units each allocated to at least two of the plurality of TSVs and configured in the same manner as the first TSV test unit.

28. The stacked semiconductor apparatus according to claim 27, wherein the first chip further comprises:
- an output unit configured to receive and latch a plurality of single test results including the first single test result outputted by the plurality of TSV test units, and serially output the plurality of single test results in response to a clock signal.

29. The stacked semiconductor apparatus according to claim 28, wherein the output unit comprises:
- a plurality of flip-flops connected in series and configured to respectively receive the plurality of single test results.

30. The stacked semiconductor apparatus according to claim 28, wherein the first chip further comprises:
- a pad configured to output an output signal of the output unit to an external device.

31. The stacked semiconductor apparatus according to claim 1, wherein the second chip comprises:
- a plurality of TSVs including the second TSV; and
- a plurality of TSV test units each allocated to at least two of the plurality of TSVs and configured in the same manner as the second TSV test unit.

32. The stacked semiconductor apparatus according to claim 31, wherein the second chip further comprises:
- an output unit configured to receive and latch a plurality of single test results including the second single test results outputted from the plurality of TSV test units, and serially output the plurality of single test results in response to a clock signal.

33. The stacked semiconductor apparatus according to claim 32, wherein the output unit comprises:
- a plurality of flip-flops connected in series and configured to respectively receive the plurality of single test results.

34. The stacked semiconductor apparatus according to claim 32, wherein the second chip further comprises:
- a pad configured to output an output signal of the output unit to an external device.

\* \* \* \* \*